(12) United States Patent
Granade et al.

(10) Patent No.: US 10,469,087 B1
(45) Date of Patent: Nov. 5, 2019

(54) BAYESIAN TUNING FOR QUANTUM LOGIC GATES

(71) Applicant: Microsoft Technology Licensing, LLC, Redmond, WA (US)

(72) Inventors: Christopher Evan Granade, Redmond, WA (US); John King Gamble, IV, Redmond, WA (US); Nathan O. Wiebe, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/154,552

(22) Filed: Oct. 8, 2018

(51) Int. Cl.
| H03K 19/195 | (2006.01) |
| B82Y 10/00 | (2011.01) |
| G06N 10/00 | (2019.01) |

(52) U.S. Cl.
CPC ............ *H03K 19/195* (2013.01); *B82Y 10/00* (2013.01); *G06N 10/00* (2019.01)

(58) Field of Classification Search
CPC ....... B82Y 10/00; G06N 10/00; H03K 19/195
See application file for complete search history.

(56) References Cited

U.S. PATENT DOCUMENTS

| 2018/0101784 A1* | 4/2018 | Rolfe | G06K 9/6256 |
| 2018/0330264 A1* | 11/2018 | Lanting | G06N 10/00 |
| 2019/0007051 A1* | 1/2019 | Sete | H03K 19/195 |

OTHER PUBLICATIONS

Steve Flammia, Characterization of quantum devices, QIP Tutorial Seattle Jan. 14, 2017 (Year: 2017).*
Rothman, et al., "Observable-preserving control of quantum dynamics over a family of related systems", In Journal of Physical Review A, vol. 72, Issue 2, Aug. 28, 2005, 15 Pages.
Beltrani, et al., "Exploring the Capabilities of Quantum Optimal Dynamic Discrimination", The Journal of Chemical Physics, vol. 130, Issue 16, Apr. 27, 2009, 13 Pages.

(Continued)

*Primary Examiner* — Alexander H Taningco
*Assistant Examiner* — Kurtis R Bahr
(74) *Attorney, Agent, or Firm* — Alleman Hall Creasman & Tuttle LLP

(57) ABSTRACT

A method for tuning a quantum gate of a quantum computer comprises interrogating one or more qubits of the quantum computer using stored control-parameter values and yielding new data. The method further comprises computing an objective function quantifying operational quality of the quantum gate at the stored control-parameter values, such computing employing the new data in addition to a prior distribution over features used to compute the objective function. Here, the prior distribution may be obtained by previous adaptive or non-adaptive interrogation of the one or more qubits, for instance. The method further comprises updating the stored control-parameter values, expanding the prior distribution to incorporate uncertainty in the objective function at the updated control-parameter values, re-interrogating the one or more qubits using the updated control-parameter values, and re-computing the objective function using the expanded prior distribution.

20 Claims, 9 Drawing Sheets

(56) References Cited

OTHER PUBLICATIONS

Blume-Kohout, et al., "Demonstration of qubit operations below a rigorous fault tolerance threshold with gate set tomography", In Journal of Nature Communications, vol. 8, Feb. 15, 2017, pp. 1-14.
Combes, et al., "Logical Randomized Benchmarking", In Publication of arXiv preprint arXiv:1702.03688, Feb. 13, 2017, pp. 1-17.
Doucet, et al., "A Tutorial on Particle Filtering and Smoothing: Fifteen Years", Retrieved from: https://www.stats.ox.ac.uk/~doucet/doucet_johansen_tutorialPF2011.pdf, Mar. 2012, 41 Pages.
Egger, et al., "Adaptive Hybrid Optimal Quantum Control for Imprecisely Characterized Systems", In Journal of Physical Review Letters, vol. 112, Issue 24, Jun. 20, 2014, pp. 1-11.
Ferrie, et al., "Robust and efficient in situ quantum control", In Journal of Physical Review A vol. 91, Issue 5, May 7, 2015, pp. 1-9.
Granade, et al., "Accelerated randomized benchmarking", In New Journal of Physics, vol. 17, Issue 1, Jan. 20, 2015, pp. 1-11.
Granade, Christopher E., "Characterization, Verification and Control for Large Quantum Systems", In Thesis of University of Waterloo, Mar. 31, 2015, 259 Pages.
Granade, et al., "Qinfer: Statistical inference software for quantum applications", In Journal of Quantum vol. 1, Issue 5, Apr. 25, 2017, pp. 1-19.
Granade, et al., "Structured filtering", In New Journal of Physics, vol. 19, Aug. 16, 2017, pp. 1-22.
Hincks, et al., "Bayesian Inference for Ran-domized Benchmarking Protocols", In Publication of arXiv preprint arXiv:1802.00401, Feb. 1, 2018, pp. 1-31.
Hincks, et al., "Statistical Inference with Quantum Measurements: Methodologies for Nitrogen Vacancy Centers in Diamond", In Journal of New Journal of Physics, vol. 20, Issue 1, Jan. 2018, pp. 1-41.
Kelly, et al., "Optimal quantum control using randomized benchmarking", In Journal of Physical review letters, vol. 112, Jun. 20, 2014, 4 Pages.
Khaneja, et al., "Optimal control of coupled spin dynamics: design of NMR pulse sequences by gradient ascent algorithms", In Journal of Magnetic Resonance, vol. 172, Issue 2, Feb. 2005, 27 Pages.
Kimmel, et al., "Robust Calibration of a Universal Single-Qubit Gate-Set via Robust Phase", In Journal of Physical Review A, vol. 92, Issue 6, Dec. 2015, pp. 1-15.
Kimmel, et al., "Robust Extraction of Tomographic Information via Randomized Benchmarking", In Journal of Physical Review X, vol. 4, Issue 1, Mar. 25, 2014, 17 Pages.
Liu, et al., "Combined parameter and state estimation in simulation-based? Fltering", In Publication of Springer, 2001, pp. 1-28.
Magesan, et al., "Efficient Measurement of Quantum Gate Error by Interleaved Randomized Benchmarking", In Journal of Physical review letters, vol. 109, Issue 8, Aug. 24, 2012, 5 Pages.
Merkel, et al., "Self-consistent quantum process tomography", In Journal of Physical Review A, vol. 87, Issue 6, Jun. 2013, pp. 1-10.
Proctor, et al., "What randomized benchmarking actually measures", In Journal of Physical review letters, vol. 119, Issue 13, Sep. 28, 2017, pp. 1-10.
Rosi, et al., "Fast closed-loop optimal control of ultracold atoms in an optical lattice", In Journal of Physical Review A, vol. 88, Issue 2, Aug. 1, 2013, pp. 1-5.
Rothman, et al., "Observable-preserving control of quantum dynamics over a family of related systems", In Journal of Physical Review A, vol. 72, Issue 2, Aug. 28, 2005. 5 pages.
Rudnicki, et al., "Gauge invariant information concerning quan-tum channels", In Publication of arXiv preprint arXiv:1707.06926, Jul. 2017, pp. 1-11.
Shir, et al., "Quantum control experiments as a testbed for evolutionary multi-objective algorithms", In publication of Springer, Dec. 2012, pp. 1-46.
Spall, et al., "Multivariate stochastic approximation using a simultaneous perturbation gradient approximation", In Journal of IEEE Transactions on Automatic Control, vol. 37, Issue 3, Mar. 1992, pp. 332-341.
Wallman, et al., "Estimating the coherence of noise", In New Journal of Physics, vol. 17, Issue 11, Nov. 5, 2015, pp. 1-10.
Wallman, Joel J., "Randomized benchmarking with gate-dependent noise", In Publication of arXiv preprint arXiv:1703.09835, Mar. 2017, pp. 1-17.
Watrous, John, "The theory of quantum information", In Publication of Cambridge University Press., May 2018, 598 Pages.

* cited by examiner

BAYESIAN TUNING FOR QUANTUM LOGIC GATES

BACKGROUND

A quantum computer is a physical machine configured to execute logical operations based on or influenced by quantum-mechanical phenomena. Such logical operations may include, for example, mathematical computation. Current interest in quantum-computer technology is motivated by theoretical analysis suggesting that the computational efficiency of an appropriately configured quantum computer may surpass that of any non-quantum-mechanical computer, especially when applied to certain types of problems. Such problems include, for example, integer factorization, data searching, computer modeling of quantum phenomena, function optimization, and solution of systems of linear equations. Moreover, it is widely predicted that continued miniaturization of conventional computer logic structures will ultimately lead to the development of nanoscale logic components that exhibit quantum effects, and must therefore be addressed according to quantum-computing principles.

Like any computing system, a quantum computer is configured to accept a series of inputs and to provide a series of outputs. The internal componentry linking the inputs to the outputs of a quantum computer may require adjustment, calibration, and/or tuning in order to ensure that appropriate outputs are provided pursuant to the inputs.

SUMMARY

This disclosure describes, inter alia, an example method for tuning a quantum gate of a quantum computer. The method comprises interrogating one or more qubits of the quantum computer using stored control-parameter values and yielding new data. The method further comprises computing an objective function quantifying operational quality of the quantum gate at the stored control-parameter values, such computing employing the new data in addition to a prior distribution over features used to compute the objective function. Here, the prior distribution may be obtained by previous adaptive or non-adaptive interrogation of the one or more qubits, for instance. The method further comprises updating the stored control-parameter values, expanding the prior distribution to incorporate uncertainty in the objective function at the updated control-parameter values, re-interrogating the one or more qubits using the updated control-parameter values, and re-computing the objective function using the expanded prior distribution.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
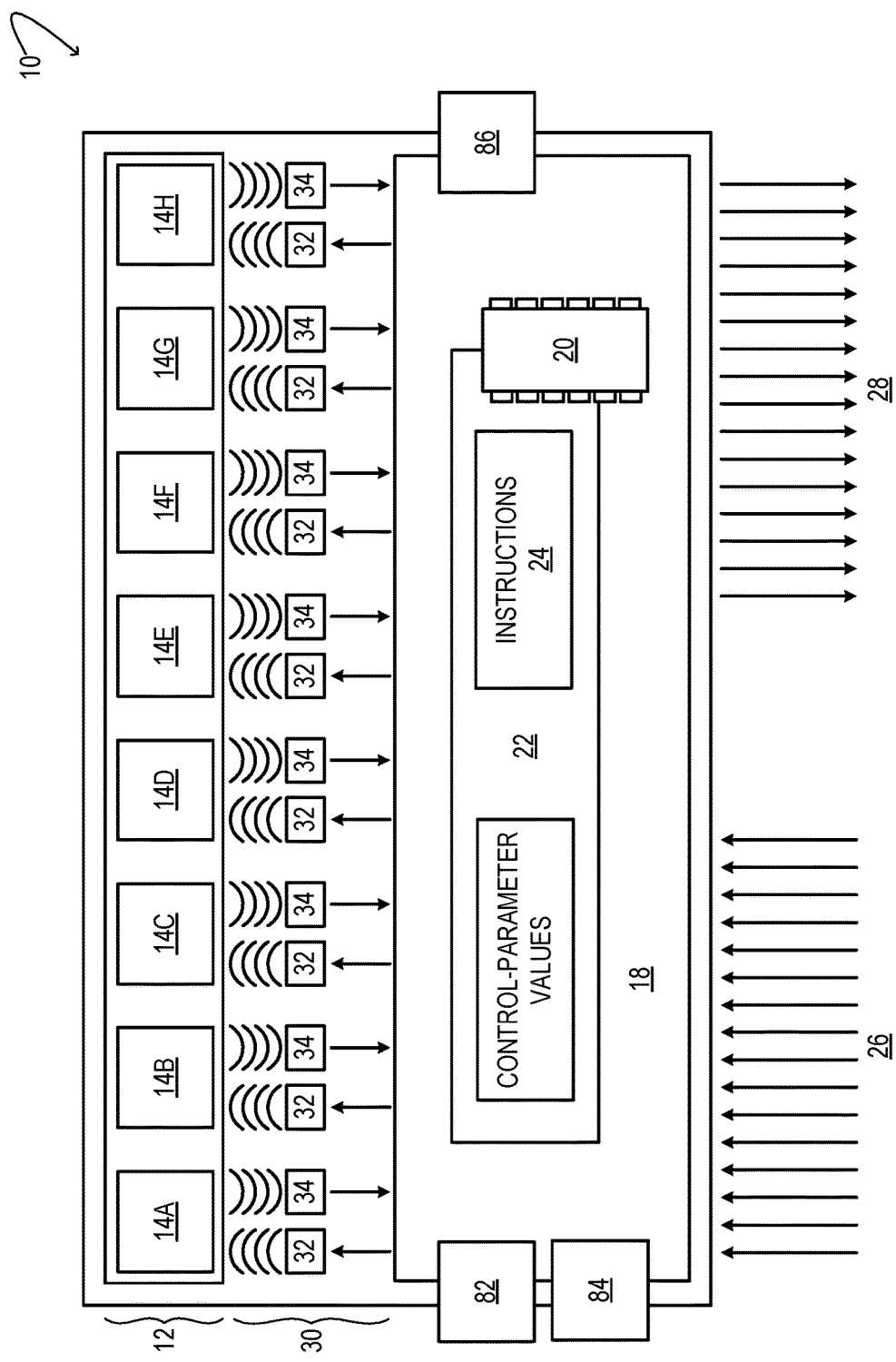
FIG. 1 shows aspects of an example quantum computer.

Aspects of this disclosure will now be described by example and with reference to the drawing figures listed above. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

FIG. 1 shows aspects of an example quantum computer 10 configured to execute quantum-logic operations (vide infra). Whereas conventional computer memory holds digital data in an array of bits and enacts bit-wise logical operations, a quantum computer holds data in an array of qubits and operates quantum-mechanically on the qubits in order to implement the desired logic. Accordingly, quantum computer 10 of FIG. 1 includes at least one register 12 comprising an array of qubits 14. The illustrated register is eight qubits in length; registers comprising longer and shorter qubit arrays are also envisaged, as are quantum computers comprising two or more registers of any length.

The qubits of register 12 may take various forms, depending on the desired architecture of quantum computer 10. Each qubit 14 may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as nonlimiting examples. More generally, each qubit 14 may comprise any particle or system of particles that can exist in two or more discrete quantum states that can be measured and manipulated experimentally. For instance, a qubit may also be implemented in the plural processing states corresponding to different modes of light propagation through linear optical elements (e.g., mirrors, beam splitters and phase shifters), as well as in states accumulated within a Bose-Einstein condensate.

Figure 2:
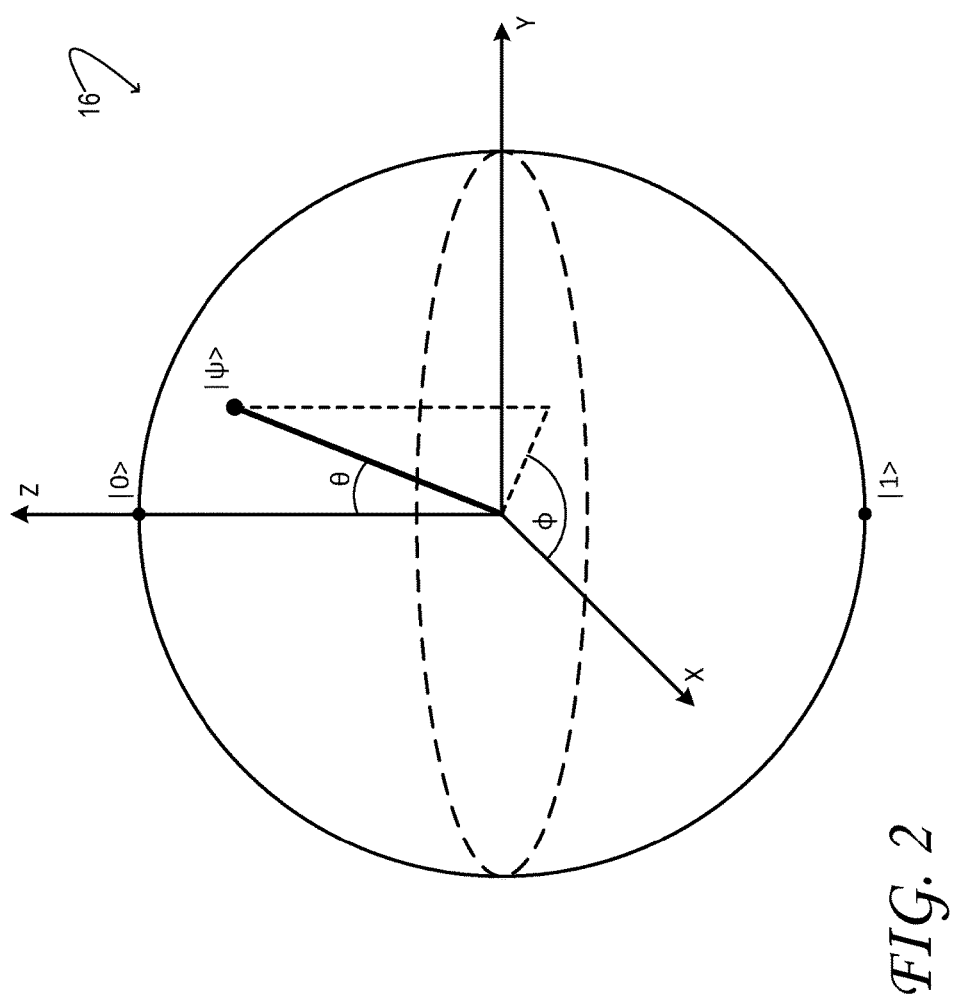
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors |0> and |1>, respectively—up and down spin states, for example, of an electron or other fermion. The set of points on the surface of the Bloch sphere comprise all possible pure states |ψ> of the qubit, while the interior points correspond to all possible mixed states. A mixed state of a given qubit may result from decoherence which may occur because of undesirable couplings to external degrees of freedom.

Returning now to FIG. 1, quantum computer 10 includes a controller 18. The controller may comprise conventional electronic componentry, including at least one processor 20 and associated computer memory 22. The term 'conventional' is applied herein to any component that can be modeled as an ensemble of particles without considering the quantum state of any individual particle. Conventional electronic components include integrated, microlithographed transistors, resistors, and capacitors, for example. Computer memory 22 may be configured to hold program instructions 24 that cause processor 20 to execute any process described herein. Additional aspects of controller 18 are described hereinafter.

Controller 18 of quantum computer 10 is configured to receive a plurality of inputs 26 and to provide a plurality of outputs 28. The inputs and outputs may each comprise digital and/or analog lines. At least some of the inputs and outputs may be data lines through which data is provided to and extracted from the quantum computer. Other inputs may comprise control lines via which the operation of the quantum computer may be adjusted or otherwise controlled.

Controller 18 is operatively coupled to register 12 via interface 30. The interface is configured to exchange data bidirectionally with the controller. The interface is further configured to exchange signal corresponding to the data bidirectionally with the register. Depending on the architecture of quantum computer 10, such signal may include electrical, magnetic, and/or optical signal. Via signal conveyed through the interface, the controller may interrogate and otherwise influence the quantum state held in the register, as defined by the collective quantum state of the array of qubits 14. To this end, the interface includes at least one modulator 32 and at least one demodulator 34, each coupled operatively to one or more qubits of register 12. Each modulator is configured to output a signal to the register based on modulation data received from the controller. Each demodulator is configured to sense a signal from the register and to output data to the controller based on the signal. The data received from the demodulator may, in some scenarios, be an estimate of an observable to the measurement of the quantum state held in the register.

More specifically, suitably configured signal from modulator 32 may interact physically with one or more qubits 14 of register 12 to trigger measurement of the quantum state held in one or more qubits. Demodulator 34 may then sense a resulting signal released by the one or more qubits pursuant to the measurement, and may furnish the data corresponding to the resulting signal to the controller. Stated another way, the demodulator may be configured to reveal, based on the signal received, an estimate of an observables reflecting the quantum state of one or more qubits of the register, and to furnish the estimate to controller 18. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on an interface line into the controller. Generally speaking, any measurement of a quantum-mechanical state is defined by the operator Ô corresponding to the observable to be measured; the result R of the measurement is guaranteed to be one of the allowed eigenvalues of Ô. In quantum computer 10, R is statistically related to the register state prior to the measurement, but is not uniquely determined by the register state.

Pursuant to appropriate input from controller 18, interface 30 may be further configured to implement one or more quantum-logic gates to operate on the quantum state held in register 12. Whereas the function of each type of logic gate of a conventional computer system is described according to a corresponding truth table, the function of each type of quantum gate is described by a corresponding operator matrix. The operator matrix operates on (i.e., multiplies) the complex vector representing the register state and effects a specified rotation of that vector in Hilbert space.

For example, the Hadamard gate H is defined by $$H = \frac{1}{\sqrt{2}}\begin{bmatrix} 1 & 1 \\ 1 & -1 \end{bmatrix} \quad (1)$$

The H gate acts on a single qubit; it maps the basis state |0> to (|0>+|1>)/√2, and maps |1> to (|0>-|1>)/√2. Accordingly, the H gate creates a superposition of states that, when measured, have equal probability of revealing |0> or |1>.

The phase gate S is defined by $$S = \begin{bmatrix} 1 & 0 \\ 0 & e^{i\pi/2} \end{bmatrix}. \quad (2)$$

The S gate leaves the basis state |0> unchanged but maps |1> to $e^{i\pi/2}$|1>. Accordingly, the probability of measuring either |0> or |1> is unchanged by this gate, but the phase of the quantum state of the qubit is shifted. This is equivalent to rotating ψ by 90 degrees along a circle of latitude on the Bloch sphere (FIG. 2).

Some quantum gates operate on plural qubits. The SWAP gate, for example, acts on two distinct qubits and swaps their values. This gate is defined by $$\text{SWAP} = \begin{bmatrix} 1 & 0 & 0 & 0 \\ 0 & 0 & 1 & 0 \\ 0 & 1 & 0 & 0 \\ 0 & 0 & 0 & 1 \end{bmatrix}. \quad (3)$$

The foregoing list of quantum gates and associated operator matrices is nonexhaustive, but is provided for ease of illustration. Other quantum gates include Pauli −X, −Y, and −Z gates, the √NOT gate, additional phase-shift gates, the √SWAP gate, controlled cX, cY, and cZ gates, and the Toffoli, Fredkin, Ising, and Deutsch gates, as nonlimiting examples.

Figure 4:
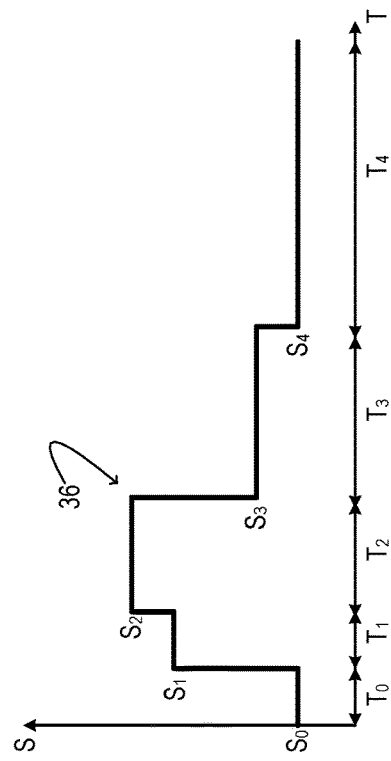
FIG. 4 is an illustrative plot of a composed signal waveform applied to a qubit register of a quantum computer.
Figure 3:
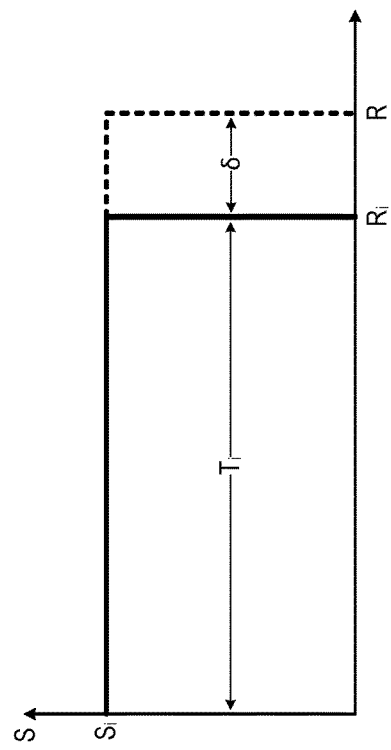
FIG. 3 is an illustrative plot of a rotation R effected in a qubit register of a quantum computer as a function of applied signal amplitude S.

Continuing in FIG. 1, suitably configured signal from modulators 32 of interface 30 may interact physically with one or more qubits 14 of register 12 so as to assert any desired quantum-gate operation. As noted above, the desired quantum-gate operations are specifically defined rotations of a complex vector representing the register state. In order to effect a desired rotation Ô, one or more modulators of interface 30 may apply a predetermined signal level $S_i$ for a predetermined duration $T_i$, as shown in FIG. 3. In some examples, plural signal levels may be applied for plural sequenced or otherwise associated durations. In the more particular example of FIG. 4, the plural signal levels and durations are arranged to form a composite signal waveform 36, which may be applied to one or more qubits of the register. In general, each signal level $S_i$ and each duration $T_i$ is a control parameter adjustable by appropriate programming of controller 18. In other quantum-computing architectures, different sets of adjustable control parameters may control the quantum operation applied to the register state.

In many instances, the desired values of the signal levels, signal durations, or other control parameters appropriate to effect a desired quantum-gate operation can only be estimated. Any error in the estimate may result in an errant rotation of the register state that differs from the desired rotation by an overrotation amount δ (in FIG. 3). To create a functioning quantum logic gate, the overrotation δ is made as small as practicable by optimization of the various control-parameter values. This process is referred to as 'tuning' a quantum gate.

Tuning gates in quantum computers is a task of fundamental importance to building a quantum computer. Without tuning, most quantum computers would have insufficient accuracy to implement a simple algorithm, let alone achieve the stringent requirements on gate fidelity or other quality metrics necessary for quantum error correction. Historically, qubit tuning has largely been done with the aid of human intuition, with experimentalists attempting to set physical parameters of the quantum gates in order to calibrate their individual pulses. Recently, alternatives have been advanced that allow devices to be tuned algorithmically in order to improve performance based on real-world estimates of quantum-gate quality.

In some tuning methods, overrotations for one or more quantum-gate operations are subsumed into an overall merit function over the set of adjustable parameters. The merit function is evaluated iteratively using different trial parameter values, in order to discover the optimal set. One example merit function is the average gate fidelity (AGF), defined hereinafter. Methods based on numerically optimizing the average gate fidelity are powerful, but present two issues. First, all such methods require substantial input data (i.e., estimates of quantum-mechanical observables) in order to compute the AGF and to estimate its gradient. Second, no previously available method can use prior information to reduce the amount of required data. The present approach, herein referred to as Bayesian Acronym tuning (or BACRONYM), addresses these problems.

A protocol invented by Ferrie and Moussa, herein referred to as ACRONYM, used randomized benchmarking (RB) to provide an estimate of gate fidelity as a function of the control-parameter values. Randomized benchmarking has the ability to give an efficient estimate under reasonable assumptions. Further, the algorithm can use a protocol, similar, in some examples, to the simultaneous stochastic perturbative approximation (SPSA) of Spall, to optimize the estimate of the AGF by varying the control-parameter values, and continue to update the parameters until the desired tolerance is reached.

The optimization used in ACRONYM involves varying each parameter slightly and applying the fidelity estimation protocol from scratch at every iteration. This feature is a disadvantage because accurate estimation of the merit function (e.g., AGF) may require significant experimental data. Moreover, the disadvantage is magnified because redundant evaluation is necessary at every iteration in order for a statistically meaningful distribution of data to be accumulated for each set of trial parameter values. This derives from the fact that measurement of any quantum observable reveals a distribution of allowed eigenvalues centered on an expectation value, as opposed to a unique value of the observable. Accordingly, execution of ACRONYM or other such procedures may introduce non-negligible latency to quantum-gate calibration.

The inventors herein have discovered, however, that approaches such as ACRONYM actually consume more data than is strictly needed, because if the quantum system is evaluated at two nearby points, then the objective function is unlikely to change very much within the gradient calculation step. Thus, by using prior information extracted from the previous iteration in SPSA, the data needed to obtain an estimate of the gradient can be reduced.

Bayesian methods allow prior information to be used for parameter estimation. These methods, specifically, can be used to yield estimates of the AGF based on prior beliefs about randomized benchmarking parameters as well as on evidence obtained experimentally. Bayesian methods begin by taking as input a probability distribution for the AGF as a function of the control-parameter values θ, Pr(AGF|θ), which can be interpreted as the prior beliefs ascribed to the AGF. They further require, either explicitly or implicitly, a method for computing the likelihood of seeing a set of experimental evidence E, known as a likelihood function, which, in the case of Bayesian randomized benchmarking, is Pr(E|AGF; θ). The methods then output an approximation to the posterior probability distribution, which can be interpreted as the probability one should ascribe to the AGF taking a specific value conditioned on prior beliefs and on E. This can be computed using Bayes' theorem:

$$Pr(AGF \mid E; \theta) = \frac{Pr(AGF \mid \theta) Pr(E \mid AGF; \theta)}{Pr(E \mid \theta)}, \qquad (4)$$

where Pr(E|θ) can be thought of as just a normalization constant. From the posterior distribution Pr(AGF|E; θ) an estimate of AGF is extracted through either the mean of the distribution or through an estimate of the uncertainty in the AGF using the variance of the distribution.

According to the ideas introduced above, the uncertainty in parameters like AGF that occurs from transitioning from θ→θ' in the optimization process is a continuous function of ||θ−θ'||, provided that the quantum channels that describe the underlying gates are continuous functions of the control parameters. This provides a rule that can be followed in order to assess how much uncertainty must be added to the posterior distribution Pr(AGF|E; θ) in order to use it as a prior Pr(AGF|θ') at the next step of the gradient optimization procedure. This feature provides a robust framework for Bayesian ACRONYM tuning of quantum logic gates. By reducing the latency of the tuning process through data reuse, the task of providing and maintaining proper tuning of quantum computer takes less operational time and leaves more time for the quantum computer to solve problems.

Figure 5:
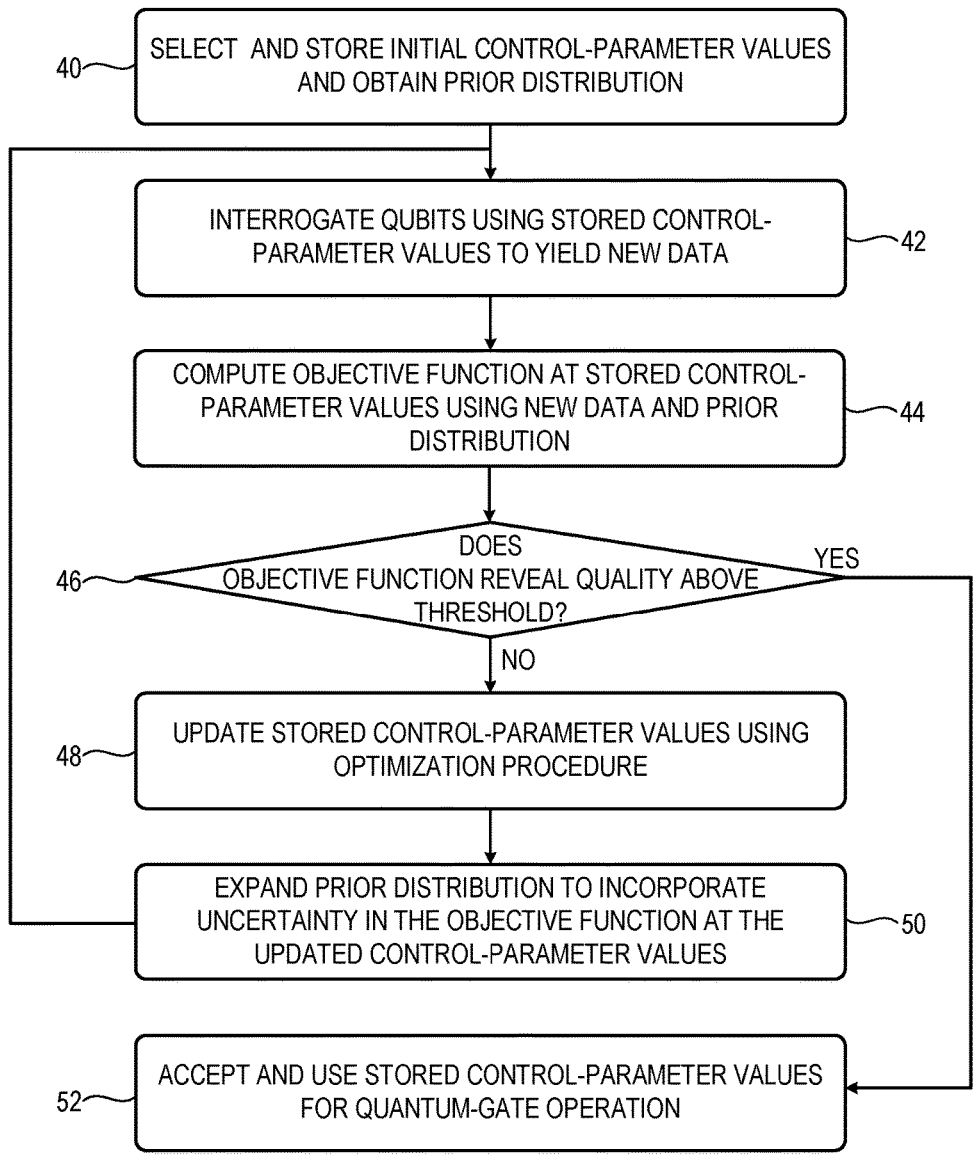
FIG. 5 illustrates an example Bayesian tuning method applied to a quantum logic gate of a quantum computer.

FIG. 5 illustrates an example method 38 for tuning a quantum gate of a quantum computer. At 40 an initial set of control-parameter values is selected and stored, and an initial prior distribution (i.e., probability distribution) is obtained over features that will be used to compute the objective function. In some examples, the initial prior distribution may be obtained based on the initially selected control-parameter values. Bayesian methods are generally agnostic as to how to obtain an initial prior distribution. Nonlimiting examples may include an exhaustive study of faults in similar devices, a first-principles calculation of likely overrotation given hypothetical noise sources, or adoption of a conservative (e.g., uniform) prior over a plausible range of different fidelities. In general, the distribution is over the figure of merit for a quantum-logic gate at the initial control parameters. In the RB example to be considered hereinafter, this implies that the initial distribution is over the fidelity. In other examples, the initial prior may be over some measure of agreement between a program as implemented on an actual quantum computer versus a hypothetical noiseless machine.

At 42 one or more qubits of the quantum computer are interrogated using the stored control-parameter values. This action yields a set of new data providing an estimate of performance metrics of the quantum device. In some examples, the one or more qubits may be interrogated according to an RB protocol, as described in further detail herein. Briefly, such interrogation may include subjecting the one or more qubits to a sequence of quantum gates. In some examples, that action may be followed by reversal of the applied quantum-gate sequence, followed further by measurement of the quantum state of the one or more qubits.

At 44 an objective function quantifying operational quality of the quantum gate at the stored control-parameter values is computed. The form of the objective function is not particularly limited in method 38, but may vary in relation to at least one overrotation of a quantum state of the one or more qubits when subjected to a quantum-gate operation. In some examples, the objective function may represent the fidelity of a plurality of different quantum-gates, such that each of the plurality of different quantum gates is tuned via method 38. In some examples, computing the objective function may include estimating an average gate fidelity over an ensemble of randomly selected quantum gates. Computation of the objective function may employ the newly measured data in addition to the prior distribution over the features used to compute the objective function, such features having been obtained by previous adaptive or non-adaptive interrogation of the qubits (e.g., using previous control-parameter values).

If, at 46, the operational quality represented by the objective function fails to exceed a threshold operational quality, then, at 48, the stored control-parameter values are updated based on a suitable optimization procedure. The control-parameter values may be updated according to a multivariable parameter-optimization algorithm, for example. In a more particular example, SPSA may be used. In examples in which the operational quality comprises a quantum-gate fidelity, the threshold operational quality may comprise a threshold quantum-gate fidelity determined, for instance, based on an estimate of a posterior uncertainty in the quantum-gate fidelity as quantified by the objective function. Then, at 50, the prior distribution is expanded to incorporate uncertainty in the objective function at the updated control-parameter values. Execution of the method now returns to 42 for another evaluation of the objective function. If the objective function exceeds the threshold operational quality, then the stored control-parameter values, at 52, are accepted and used subsequently to enact the operation of the quantum gate.

The notation used in this disclosure necessarily spans several fields, most notably Bayesian inference and randomized benchmarking theory. The notational conventions particular to these fields is now briefly introduced. For any distribution Pr(x) over a vector x of random variables, supp(Pr(x)) indicates the set of vectors x such that Pr(x)>0. When it is clear from context, supp(x|y) is written in place of supp(Pr(x|y)).

Let $\mathcal{H} = \mathbb{C}^d$ be a finite-dimensional Hilbert space describing the states of a quantum system of interest, and let $\mathcal{L}(\mathcal{H})$ be the set of linear operators acting on $\mathcal{H}$. Let $U(\mathcal{H}) \subsetneq \mathcal{L}(\mathcal{H})$ be the set of unitary operators acting on $\mathcal{H}$. For the most part, however, pure states $|\psi\rangle \in \mathcal{H}$ are of less concern than classical distributions over such states, which are described by density operators $\rho \in d(\mathcal{H}) \subsetneq \text{Herm}(\mathcal{H}) \subsetneq \mathcal{L}(\mathcal{H})$. Whereas $\mathcal{H}$ transforms under $U(\mathcal{H})$ by left action, $d(\mathcal{H})$ transforms under $U(\mathcal{H})$ by the group action $\bullet: U(\mathcal{H}) \times \mathcal{L}(\mathcal{H}) \to \mathcal{L}(\mathcal{H})$, given by $U \bullet \rho := U\rho U^\dagger$. In particular, $\bullet$ is linear in its second argument, such that for a particular $U \in U(\mathcal{H})$, $U \bullet : \mathcal{L}(\mathcal{H}) \to \mathcal{L}(\mathcal{H})$ is a linear function. Thus, $U \bullet \in \mathcal{L}(\mathcal{L}(\mathcal{H}))$. Moreover, since $U \bullet$ is a completely positive and trace preserving map on $\mathcal{L}(\mathcal{H})$, $U \bullet$ is said to be a channel on $\mathcal{H}$, written $C(\mathcal{H}) \subsetneq \mathcal{L}(\mathcal{L}(\mathcal{H})) \subsetneq \mathcal{L}(\mathcal{H}) \to \mathcal{L}(\mathcal{H})$.

Before proceeding further, it is helpful to carefully define the problem addressed in this disclosure. In particular, let $G = \langle V_0, \ldots, V_{l-1} \rangle \subsetneq U(\mathcal{H})$ be a group and a 2-design, such that G is appropriate for use in standard randomized benchmarking. Often, G will be the Clifford group acting on a Hilbert space of dimension d, but smaller twirling groups may be chosen in some circumstances. The generator $T := V_0$ is a gate to be improved as a function of a vector $\theta$ of control parameters, such that $T = T(\theta)$. The expression $V_i \perp \theta$ for all $i \geq 0$ is written to indicate that the other generators $\{V_0, \ldots, V_{l-1}\}$ are not functions of the controls $\theta$ (Note that $V_0$ is manifestly not a function of the controls because it represents the ideal action). Nonetheless, it is often convenient to write that $V_i = V_i(\theta)$ with the understanding that $\partial_{\theta_j} V_i = 0$ for all $i > 0$ and for all control parameters $\theta_j$.

In order to reason about the errors in an implementation of each generator, the imperfect implementation $\tilde{V} \in C(\mathcal{H})$ of a generator $V \in \{V_0, \ldots, V_{l-1}\}$ will be defined as $$\tilde{V} = \Lambda_V(V \bullet) \tag{5}$$

which acts on $\rho$ as $$\tilde{V}[\rho] = \Lambda_V[V \rho V^\dagger], \tag{6}$$

where $\Lambda_V$ is the discrepancy channel describing the errors in V. For an ideal implementation, $\Lambda_V$ is the identity channel.

This definition is now extended to arbitrary elements of G in a straightforward fashion. Let $U = \prod_{i \in i(U)} V_i$, where $i(U)$ is the sequence of indices of each generator in the decomposition of U. For instance, if $G = \langle H, S \rangle$ for the phase gate $S = \text{diag}(1, i)$, then $\sqrt{X} = HSH$ is represented by $i(U) = (0, 1, 0)$. This decomposition into generators is now used to define $\tilde{U}$ and $\Lambda_U$, $$\Lambda_U := \left(\prod_{i \in i(U)} \tilde{V}_i\right)(U^\dagger \bullet) = \left(\prod_{i \in i(U)} \Lambda_{V_i}(V_i \bullet)\right)(U^\dagger \bullet) \tag{7}$$

-continued $$\tilde{U} := \Lambda_U(U\bullet) = \left(\prod_{i\in i(U)} \Lambda_{V_i}(V_i\bullet)\right). \quad (8)$$

Using these definitions, the discrepancy channel $\Lambda_U$ is expressed in terms of the discrepancy channels $\Lambda_{V_i}$ for each of the generators $V_i$ appearing in the expansion $U=\prod_{i\in i(U)} V_i$, resulting in $$\Lambda_U = \tilde{U}(U^\dagger\bullet) = \left(\prod_{i\in i(U)} \Lambda_{V_i}(V_i\bullet)\right)(U\bullet). \quad (9)$$

Returning to the example $\sqrt{X}$=HSH, it is observed that $$\Lambda_{\sqrt{X}} = \Lambda_H(H\bullet)\Lambda_S(S\bullet)\Lambda_H(H\bullet)((H^\dagger S^\dagger H^\dagger)\bullet) \quad (10)$$

is the discrepancy channel describing the noise incurred upon implementation $\widetilde{\sqrt{X}}$ as the sequence $\tilde{H}\tilde{S}\tilde{H}$.

Equipped with the discrepancy channels for all elements of G, the parameters of interest to randomized benchmarking over G now may be concretely stated. In particular, it is observed that standard randomized benchmarking without sequence reuse in the limit of long sequences depends only on the state preparation and measurement (SPAM) procedure and on the average gate fidelity $AGF(\Lambda_{ref}(\theta))$, where $$\Lambda_{ref}(\theta) := \mathbb{E}_{U\sim Uni(G)}[\Lambda_U] = \frac{1}{|G|}\sum_{U\in G} \Lambda_U(\theta) \quad (11)$$

is the reference channel obtained by taking the expectation value of the discrepancy channel $\Lambda_U$ over U sampled uniformly at random from G, and where the average gate fidelity is given by the expected action of a channel $\Lambda$ over the Haar measure $d\psi$, $$AGF(\Lambda) := \int d\psi \langle \psi|\Lambda(|\psi\rangle\langle\psi|)|\psi\rangle. \quad (12)$$

Similarly, interleaved randomized benchmarking without sequence reuse and in the limit of long sequences allows rigorous estimation of $AGF(\Lambda_T(\theta)\Lambda_{ref}(\theta))$.

One proposed solution to this problem employs interleaved randomized benchmarking with least-squares fitting to implement an approximate oracle for $AGF(\Lambda_T(\theta\Lambda_{ref})(\theta))$. Taken together with appropriate bounds, this approximate oracle provides an approximate lower bound on $AGF(\Lambda_{ref}(\theta))$. The lower bound can then be taken as an objective function for standard optimization routines such as Nelder-Mead to yield a "fix-up" procedure that improves gates based on experimental evidence. Improvement to that procedure has been effected with use of an optimization algorithm that is more robust to the approximations incurred by the use of finite data in the underlying randomized benchmarking experiments. In particular, the simultaneous pertubative stochastic approximation (SPSA), while less efficient for optimizing exact oracles, can provide dramatic improvements in approximate cases.

In this disclosure, further improvement is achieved by using a Lipschitz continuity assumption on the dependence of $\Lambda_T$ on $\theta$ to propagate prior information between optimization iterations. Because small gradient steps cannot greatly modify the average gate fidelity of interest under such a continuity assumption, the prior distribution for each randomized benchmarking experiment is closely related to the posterior distribution from the previous optimization iteration.

Recent work has shown, however, that this approach faces two significant challenges. Explicit counterexamples are known in which remaking $AGF(\Lambda_T(\theta))$ from $AGF(\Lambda_T(\theta)\Lambda_{ref}(\theta))$ can yield very poor estimates due to the gauge dependence of this inverse problem. Moreover, it is understood that the statistical inference problem induced by randomized benchmarking becomes considerably more complicated with sequence reuse, and in particular, depends on higher moments such as the unitarity. Although a concrete algorithm that allows for learning randomized benchmarking parameters with sequence reuse has been recently provided, the single-shot limit is believed to better address the issues above, as this is the unique randomized benchmarking protocol that provides gauge invariant estimates of $AGF(\Lambda_T(\theta)\Lambda_{ref}(\theta))$, and as this model readily generalizes to include the effects of error correction.

Following this strategy, then, a suitable objective function is $$F(\theta) := AGF(\Lambda_T(\theta)\Lambda_{ref}(\theta)). \quad (13)$$

This choice of objective rewards any improvement, regardless of whether it comes from a more accurate target gate or a more accurate reference channel. In practice, these two contributions to the objective function can be teased apart by the use of more complete protocols such as gateset tomography following the optimization procedure.

Three steps are now taken. First, it is shown that the Lipschitz continuity of $\Lambda_T(\theta)$ implies the Lipschitz continuity of $F(\theta)$. Then it is shown that this continuity implies an upper bound on $Var[F(\theta+\delta\theta)|data]$ in terms of $Var[F(\theta)|data]$, such that estimates of $\hat{F}(\theta)$ may be readily produced at each step of the optimization procedure, while reusing significant data, in order to accelerate the process. Finally, a numerical example for a representative model is presented, in order to demonstrate how such optimization may be used in practice.

Definition: Lipschitz continuity. Given a Euclidean metric space S, a function $f:S\to\mathbb{R}$ is said to be Lipschitz continuous if there exists $\mathcal{L}\geq 0$ such that for all x, $y\in S$, $$|f(x)-f(y)|\leq \mathcal{L}\|x-y\|. \quad (14)$$

The definition above is now extended to the case of functions which parameterize quantum channels by adding a constraint that over the set $d(\mathcal{H})$ of all trace-1 positive semidefinite operators acting on a Hilbert space $\mathcal{H}$. In particular, let $\mathcal{L}(\mathcal{H})$ be the set of all linear operators acting on the Hilbert space $\mathcal{H}$, and let $\mathcal{L}(\mathcal{L}(\mathcal{H}))$ be the set of linear operators acting on all such linear operators. Informally, these operators may be called "superoperators," but that term is reserved herein for the representation of $\mathcal{L}(\mathcal{L}(\mathcal{H}))$, or operators in $\mathcal{L}(\mathcal{H}\otimes\mathcal{H})$, following the Choi-Jamilkowski isomorphism.

Definition: Lipschitz continuity of channels. Given a metric space S and a Hilbert space $\mathcal{H}$, a function $\Lambda:S\to\mathcal{L}(\mathcal{L}(\mathcal{H}))$ is $\mathcal{L}$-continuous if there exists $\mathcal{L}\geq 0$ such that for all x, $y\in S$ and $\rho\in d(\mathcal{H})$, $$\|\Lambda(x)[\rho]-\Lambda(y)[\rho]\|_*\leq \mathcal{L}\|x-y\|. \quad (15)$$

If not specified explicitly, the trace norm $\|\bullet\|_*=\|\bullet\|_{Tr}$ is assumed. As a consequence of the triangle inequality, Lipschitz continuous channels respect composition.

Lemma: Composition of Lipschitz continuous functions and channels. Let $\Lambda$, $\Phi: S\to\mathcal{L}(\mathcal{L}(\mathcal{H}))$ be Lipschitz continuous in the trace distance with constants C and M, respectively. Then, $(\Phi\Lambda): x \mapsto \Phi(x)\Lambda(x)$ is Lipschitz continuous in the trace distance with constant $\mathcal{L} + M$.

Proof. The proof of this lemma follows immediately after a few applications of the triangle inequality, under the assumption of continuity of the individual channels. Thus, $\|(\Phi\Lambda)(x)[\rho] - (\Phi\Lambda)(y)[\rho]\|_{Tr} = \|\Phi(x)[\Lambda(x)[\rho]] - \Phi(y)[\Lambda(y)[\rho]]\|_{Tr}$ $= \|\Phi(x)[\Lambda(x)[\rho]] - \Phi(x)[\Lambda(y)[\rho]] + \Phi(x)[\Lambda(y)[\rho]] - \Phi(y)[\Lambda(y)[\rho]]\|_{Tr}$ $\leq \|\Phi D(x)[\Lambda(x)[\rho]] - \Phi(x)[\Lambda(y)[\rho]]\|_{Tr} + \|\Phi(x)[\Lambda(y)[\rho]] - \Phi(y)[\Lambda(y)[\rho]]\|_{Tr}$ $\leq \|\Phi(x)[\Lambda(x)[\rho]] - (x)[\Lambda(y)[\rho]]\|_{Tr} + M\|x - u\|$ $\leq \|\Lambda(x)[\rho] - \Lambda(y)[\rho]\|_{Tr} + M\|x - y\|$ $\leq \mathcal{L}\|x - y\| + M\|x - y\|$, where the second-to-last line follows from contradiction on Helstrom's theorem.

The above lemma immediately implies that if $\Lambda(\theta)$ is Lipschitz continuous in the trace distance with constant $\mathcal{L}$, then so is $(\Phi\Lambda)(\theta)$ for any channel $\Phi \perp \theta$, since $\Phi$ can be written as a channel that is Lipschitz continuous in the trace distance with constant 0.

Corollary: Composition of multiple Lipschitz continuous functions and channels. Let $\Lambda_0, \Lambda_1, \ldots, \Lambda_k : S \to \mathcal{L}(\mathcal{L}(\mathcal{H}))$ be Lipschitz continuous in the trace distance with constants $\mathcal{L}_i$ with $i \in [0, 1, \ldots, k]$. Then, $(\Lambda_0\Lambda_1 \ldots \Lambda_k): x \mapsto \Lambda_0(x)\Lambda_1(x) \ldots \Lambda_k(x)$ is Lipschitz continuous in the trace distance with constant $$\sum_{i=0}^{k} \mathcal{L}_i.$$

Lemma. Let $\Lambda: S \to \mathcal{L}(\mathcal{L}(\mathcal{H}))$ be a convex combination of channels, $$\Lambda(\theta) = \sum_i p_i \Lambda_i(\theta), \quad (16)$$

where $\{p_i\}$ are nonnegative real numbers such that $\Sigma_i p_i = 1$, and where each $\Lambda_i: S \to \mathcal{L}(\mathcal{L}(\mathcal{H}))$ is Lipschitz continuous in a norm $\|\bullet\|_*$ with constant $\mathcal{L}_i$. Then, $\Lambda$ is Lipschitz continuous with constant $\overline{\mathcal{L}} = \Sigma_i p_i \mathcal{L}_i$.

Proof. Consider an input state $\rho \in d(\mathcal{H})$. Then, $$\|\Lambda(\theta)[\rho] - \Lambda(\theta')[\rho]\|_* = \left\|\sum_i p_i(\Lambda_i(\theta)[\rho] - \Lambda_i(\theta')[\rho])\right\|_*$$

$$\leq \sum_i p_i(\|\Lambda_i(\theta)[\rho] - \Lambda_i(\theta')[\rho]\|_*)$$

$$\leq \sum_i p_i \mathcal{L}_i \|\theta - \theta'\|$$

$$= \overline{\mathcal{L}}\|\theta - \theta'\|.$$

As an example, the lemmas above are used to show that $AGF(\Lambda_T(\theta))$ is Lipschitz continuous with constant $\mathcal{L}$ when $\Lambda_T(\theta)$ is Lipschitz continuous in the trace distance with constant $\mathcal{L}$.

Theorem. Let $\Lambda(\theta)$ be Lipschitz continuous in the trace distance with constant C.

Then $AGF(\Lambda(\theta))$ is Lipschitz continuous with constant $\mathcal{L}$.

Proof. Recall that $$AGF(\Lambda(\theta)) := \int d\psi \langle \psi | \Lambda[|\psi\rangle \langle \psi|] | \psi \rangle, \quad (17)$$

such that $|AGF(\Lambda(\theta)) - AGF(\Lambda(\theta'))| = |\int d\psi \langle \Lambda(\theta)[|\psi\rangle \langle \psi|] - \Lambda(\theta')[|\psi\rangle \langle \psi|]|\psi\rangle|$ (18)

$\leq \int d\psi |\langle \Lambda(\theta)[|\psi\rangle \langle \psi|] - \Lambda(\theta')[|\psi\rangle \langle \psi|]|\psi\rangle|$ (19)

$\leq \int d\psi \|\Lambda(\theta)[|\psi\rangle \langle \psi|] - \Lambda(\theta')[|\psi\rangle \langle \psi|]\|_{Tr}$ (20)

$\leq \int d\psi \mathcal{L} \|\theta - \theta'\|$ (21)

$= \mathcal{L} \|\theta - \theta'\|.$ (22)

As noted in the introduction, direct access to $AGF(\Lambda_T(\theta))$ is not available. The present approach, therefore, is to reason instead about quantities that may be estimated using randomized benchmarking. In particular, $F(\theta) := AGF(\Lambda_T(\theta)\Lambda_{ref}(\theta))$ may be estimated from the interleaved randomized benchmarking parameters $$p(\theta) := \frac{dF(\theta) - 1}{d - 1}, \quad (23a)$$

$$A(\theta) := \text{Tr}\left(E\Lambda_{ref}(\theta)\left[\rho - \frac{\mathbb{1}}{d}\right]\right), \text{ and} \quad (23b)$$

$$B(\theta) := \text{Tr}\left(E\Lambda_{ref}(\theta)\left[\frac{\mathbb{1}}{d}\right]\right), \quad (23c)$$

where $d = \dim(\mathcal{H})$, $\rho$ is the state prepared at the start of each sequence, and where E is the measurement at the end of each sequence. The quantities A and B are subsequently considered. Up to a factor of $d/(d-1)$, however, Lipschitz continuity of $F(\theta)$ immediately implies Lipschitz continuity of $p(\theta)$. Thus, the same argument above applies here as well, but using the channel $\Lambda_T(\theta)\Lambda_{ref}(\theta)$ instead to argue the Lipschitz continuity of experimentally accessible estimates.

Lipschitz continuity of F and hence of p is now shown by revisiting the definition of $\Lambda_{ref}$. In particular, partitioning the twirling group as $G = \cup_{n=0}^{\infty} G_n$, where $G_n$ is the set of elements of G whose decomposition into generators $\{T, V_1, \ldots, V_{l-1}\}$ requires at least n instances of the target gate T. For instance, if $G = \langle S, H \rangle$ and the target gate is $T = S$, then $Z \in G_2$ since $Z = SS$ is the decomposition of Z requiring the fewest copies of S. The table below shows a partitioning of the twirling group $G = \langle H, S \rangle$ based on the number of occurrences of the target gate $T = S$ in the expansion of each element.

| | |
|---|---|
| $G_0$ | {1, H} |
| $G_1$ | {S, HS, SH, HSH} |
| $G_2$ | {SS, HSS, SHS, SSH, HSHS, HSSH} |
| $G_3$ | {SSS, HSSS, SHSS, SSHS, HSHSS, HSSHS, SHSSH, HSHSSH} |
| $G_4$ | {SHSSS, SSHSS, HSHSSS, HSSHSS} |

Figure 6:
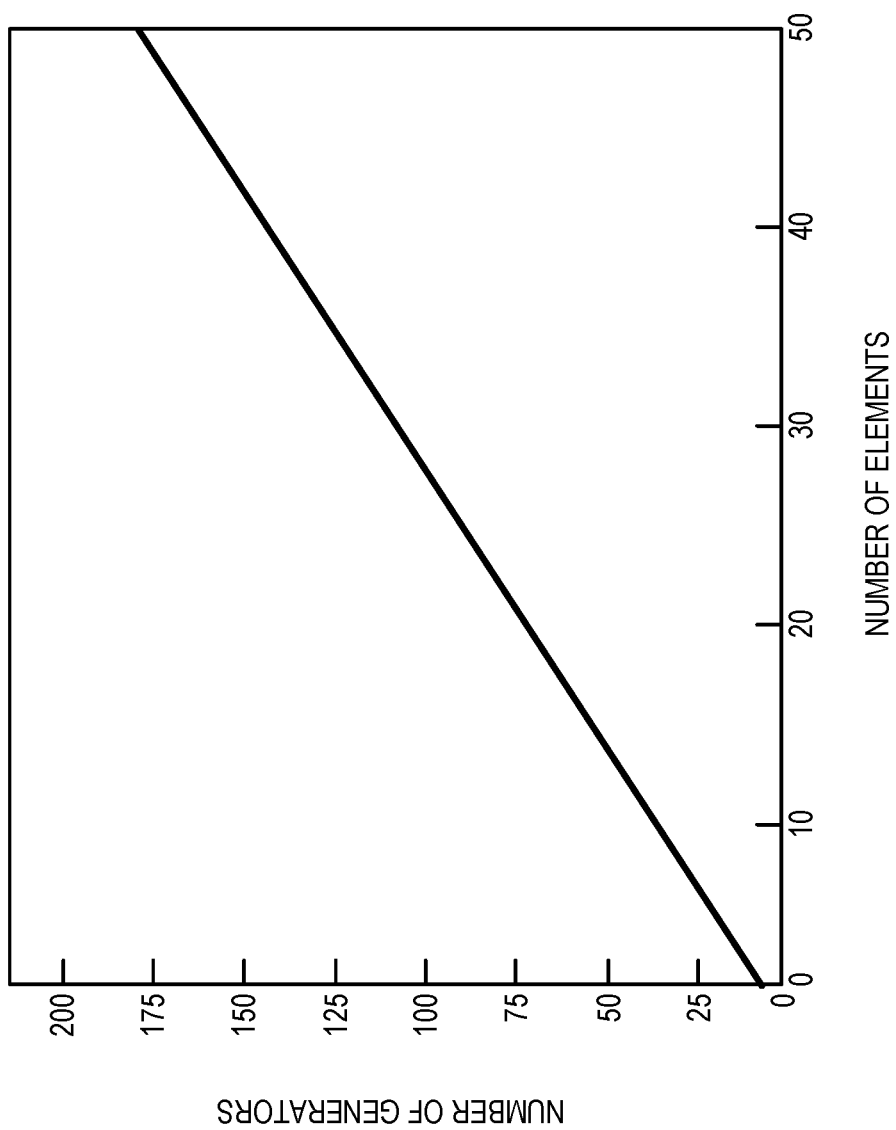
FIG. 6 is a plot of the length, in number of generators, of random benchmarking sequences as a function of the number of group elements comprising each sequence.

FIG. 6 is a plot of the length of randomized benchmarking sequences, in terms of the number of generators in the sequence, as a function of the number of group elements m comprising the sequence.

Using the above partitioning of G, an analogous partition on the terms occurring in the definition of $\Lambda_{ref}(\theta)$ is here defined, $$\Lambda_{ref}(\theta) = \sum_{n=0}^{\infty} \frac{|G_n|}{|G|} \Lambda_{ref,n}(\theta), \text{ where} \quad (24)$$

$$\Lambda_{ref,n}(\theta) := \frac{1}{|G_n|} \sum_{U \in G_n} \Lambda_U(\theta). \quad (25)$$

Theorem. If $\Lambda_T(\theta)$ is Lipschitz continuous in the trace distance with constant $\mathcal{L}$, then $\Lambda_{ref,n}(\theta)$ is Lipschitz continuous in the trace distance with constant nL.

Proof. Consider one of the summands from (25), and without loss of generality let $U=V_{i_0}V_{i_1} \ldots V_{i_k}$ k for the sequence of integer indices $i=(i_0, i_1, \ldots, i_k)$. Then, by (9), $$U = V_{i_0}V_{i_1} \ldots V_k \quad (26)$$

and $$\Lambda_U(\theta) = \Lambda_{V_{i_0}}(\theta)(V_{i_0} \bullet) \cdots \Lambda_{V_{i_k}}(\theta)(V_{i_k} \bullet)(U^\dagger \bullet). \quad (27)$$

Now $\forall i$, $V_i \perp \theta$, since the channels are ideal and therefore independent of the control vector $\theta$; these channels are Lipschitz continuous in the trace distance with constant 0. Further, each $\Lambda_{V_i} \perp \theta$ for $i>0$; these channels are also Lipschitz continuous in the trace distance with constant 0. By assumption, $\Lambda_{V_0}$ is Lipschitz continuous in the trace distance with constant $\mathcal{L}$. Hence, each factor in $\Lambda_U$ is Lipschitz continuous in the trace distance with constant $\mathcal{L}$ or 0, as detailed above.

By reason of the corollary presented hereinabove, $\Lambda_U$ is Lipschitz continuous in the trace distance with constant mL, where m counts the number of 0s in i (corresponding to the number of times the target gate occurs in the decomposition of U). By construction, m≤n, so $\Lambda_U$ is also Lipschitz continuous in the trace distance with constant nL. From the lemma to the convex combination of channels, it is observed that $\Lambda_{ref,n}(\theta)$ is Lipschitz continuous in the trace distance with constant $$\frac{1}{|G_n|} \sum_{U \in G_n} nL = nL,$$

which is the desired result.

Accordingly, $\Lambda_{ref}(\theta)$ is Lipschitz continuous in the trace distance with constant $\bar{n}\mathcal{L}$, where $$\bar{n} := \sum_{n=0}^{\infty} n \frac{|G_n|}{|G|} \quad (28)$$

is the average number of times that the target gate T appears in decompositions of elements of the twirling group G. Combining with the previous argument, the central theorem of this disclosure can be formulated.

Theorem. Let $\Lambda_T(\theta)$ be Lipschitz continuous in the trace distance with constant $\mathcal{L}$. Then, $F(\theta)=AGF(\theta)$ is Lipschitz continuous with constant $(1+\bar{n})\mathcal{L}$, and $p(\theta)$ is Lipschitz continuous with constant $d(1+\bar{n})/(d-1)\mathcal{L}$, and $A(\theta)$ and $B(\theta)$ are Lipschitz continuous with constant $\bar{n}\mathcal{L}$.

Proof. The claim that $p(\theta)$ is Lipschitz continuous follows immediately from the continuity theorems given above. Consider, then, the continuity of $B(\theta)$, $$|B(\theta')-B(\theta)|=|Tr(E\Lambda_{ref}(\theta')[\mathbb{1}/d])-Tr(E\Lambda_{ref}(\theta)[\mathbb{1}/d])|. \quad (29)$$

Based on the continuity theorem further above, $\Lambda_{ref}$ is Lipschitz continuous in the trace distance with constant $\bar{n}\mathcal{L}$. Thus, there exists a Hermitian operator $C=C(\theta, \theta')$ such that $$\Lambda_{ref}(\theta'[\mathbb{1}/d]=\Lambda_{ref}\theta[\mathbb{1}/d]+\mathcal{L}\|\theta-\theta'\|C, \quad (30)$$

and such that $\|C\|_{Tr} \leq 1$. Using this, (31) is rewritten $$|B(\theta')-B(\theta)|=|Tr(EC)|\mathcal{L}\|\theta-\theta'\|. \quad (31)$$

Since E and C are both Hermitian, EC is also Hermitian, and thus $\|EC\|_{Tr}=Tr(|EC|) \geq |Tr(EC)|$. The argument is completed by Hölder's inequality, which states that for all X and Y, $\|XY\|_{Tr} \leq \|X\|_{Tr}\|Y\|_{spec}$, where $\|\bullet\|_{spec}$ is the spectral norm (a.k.a. the induced $(2 \to 2)$-norm or Schatten $\infty$-norm). In particular, since E is a POVM effect, $\|E\|_{spec} \leq 1$, such that $\|EC\|_{Tr} \leq \|C\|_{Tr} \leq 1$. The same argument holds for the Lipschitz continuity of A, since A and B differ only in their arguments, and the only additional requirement is that C is Hermitian.

Returning now to the problem of estimating $F(\theta+\delta\theta)$ from experimental data concerning $F(\theta)$, the following theorem is proposed.

Theorem. Suppose that $f(\theta,y)$ is a Lipschitz continuous function of $\theta$ with constant $\mathcal{L}$ where y is a variable in a measurable set S with corresponding probability distribution on that set of $Pr(y)$ and for any function $g: S\mathbb{R} \mapsto$ define $\mathbb{E}_y(g(y))=\int_S g(y)Pr(y)dy$ and $Var_y(g(y))=\mathbb{E}_y g(y)-\mathbb{E}_y g(y))^2$. For all $\theta$ and $\theta'$ such that $\mathcal{L}\|\theta'-\theta\| < \sqrt{Var_y(f(\theta,y))}$, it holds that $$Var_y[f(\theta', y)] \leq Var_y[f(\theta, y)]\left(1 + \frac{2\mathcal{L}\|\theta'-\theta\|}{\sqrt{Var_y[f(\theta, y)]}}\right). \quad (32)$$

Proof. Since $f$ is Lipschitz continuous as a function of $\theta$, $$f(\theta',y)=f(\theta,y)+\mathcal{L}\|\theta'-\theta\|c(\theta,\theta',y) \quad (33)$$

for some function c such that $|c(\theta, \theta', y)| \leq 1$ for all $\theta, \theta'$ and y. Thus, $Var_y[c] \leq 1$, and by addition of variance, $$Var_y[f(\theta',y)] \leq Var_y[f(\theta,y)]+\mathcal{L}^2\|\theta-\theta'\|^2+\mathcal{L}\|\theta-\theta'\|\sqrt{Var_y(f(\theta,y))}.$$

$$\leq Var_y[f(\theta,y)]+2\mathcal{L}\|\theta-\theta'\|\sqrt{Var_y(f(\theta,y))}. \quad (34)$$

The result then follows from elementary algebra.

Example: Lipschitz Continuity of Unitary Overrotation.

Consider $G=\langle S, H \rangle$, where $T=S$ is the target gate. For a control parameter vector consisting of a single overrotation parameter $\theta=(\delta\theta)$, suppose that $\Delta_T[\rho]=(e^{-i\delta\theta\sigma_z})^*\rho$. Since this is a unitary channel, its Choi-Jamilkowski rank (also known as a "Kraus rank.") is 1. Thus, the AGF of $\Lambda_T$ can be calculated as the trace $$AGF(\Lambda_T(\delta\theta)) = \frac{|Tr(e^{-i\delta\theta\sigma_z})|^2+2}{4+2} = \frac{2}{3}+\frac{1}{3}\cos(2\delta\theta). \quad (35)$$

On the other hand, F(δθ) is less straightforward, so its Lipschitz continuity is considered instead. Accordingly, for all ρ∈d($\mathbb{C}^2$), the trac norm is to be bounded:

$$\Delta = \|\Lambda_T(\delta\theta)[\rho] - \Lambda_T(\delta\theta')[\rho]\|_{Tr} \quad (36)$$

Expanding ρ in the unnormalized Pauli basis as ρ=$\mathbb{1}$/2+r·σ/2, it is observed that since $\Lambda_T(\delta\theta)[\mathbb{1}] = \mathbb{1}$ and $\Lambda_T(\delta\theta)[\sigma_z] = \sigma_z$ for all δθ, the above becomes $$\Delta = \tfrac{1}{2}\|\Lambda_T(\delta\theta)[r_x\sigma_x + r_y\sigma_y] - \Lambda_T(\delta\theta')[r_x\sigma_x + r_y\sigma_y]\|_{Tr} \quad (37)$$

$$= 4|\sin(\delta\theta - \delta\theta')|\sqrt{r_x^2 + r_y^2} \quad (38)$$

$$\leq 4|\sin(\delta\theta - \delta\theta')| \quad (39)$$

$$\leq 4|\delta\theta - \delta\theta'|, \quad (40)$$

where the last line follows from that |sin(x)|≤|x|. Thus, $\Lambda_T$ is Lipschitz continuous in the trace distance with constant 4.

Obtained next is $\bar{n}$ for occurrences of T in decompositions of elements of G, in order to find the Lipschitz constant for F(δθ) in this example. In particular, $\bar{n}$=13/6 for the presentation of the Clifford group under consideration, such that F is Lipschitz continuous with constant (d/(d−1))×4×(19/6)= 76/3 in this case.

A more detailed analysis of the Lipschitz continuity of $\Lambda_T$ or a presentation of G that is less dense in T would both yield smaller Lipschitz constants for F, and hence better reuse of prior information. Thus by reason of the continuity theorem hereinabove, a change in overrotation of approximately 1/100 the current standard deviation in F would result in at most a doubling of the current standard deviation.

Figure 7:
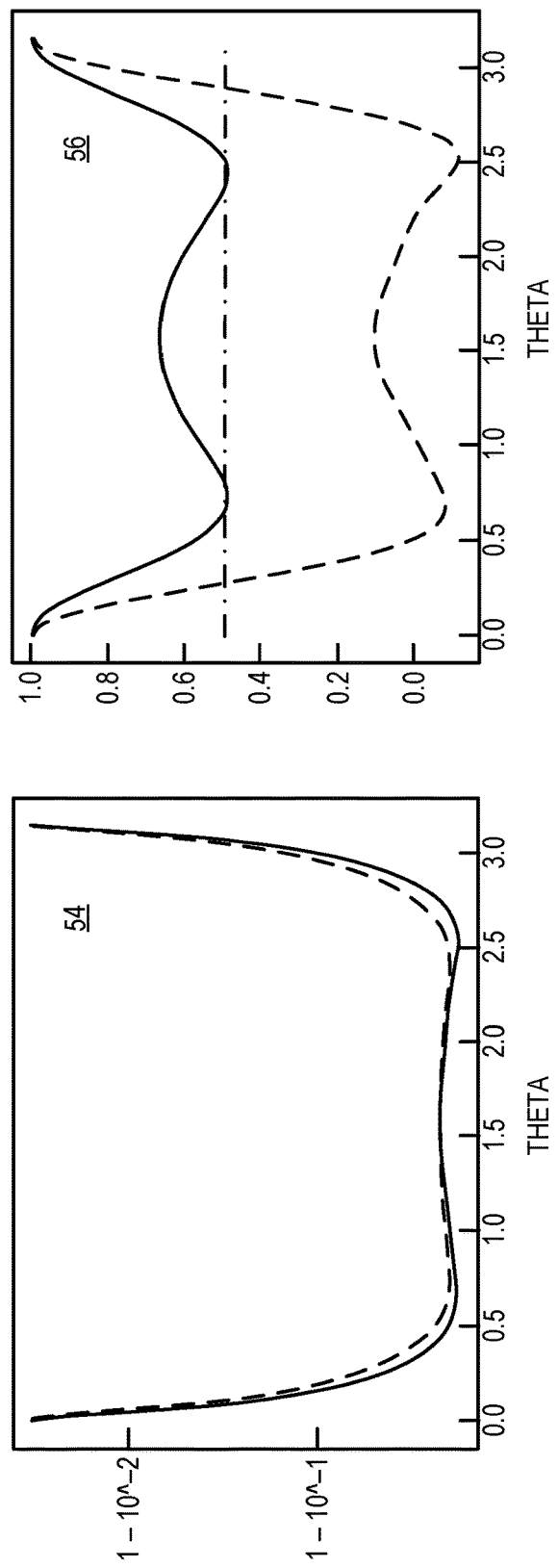
FIG. 7 shows example plots of an objective function versus overrotation angle.

Plot 54 of FIG. 7 shows how the objective function F(θ) and the AGF vary with the overrotation angle θ for the example immediately above. Here, the solid line represents F(θ), and the dashed line represents the AGF. Plot 56 of FIG. 7 shows how the RB parameters vary with θ for the same example. In this plot, the solid line represents A, the dashed line represents p, and the dot-dashed line represents B. Numerical simulation can also be used to include the effect of noise in other generators. In particular, suppose that $\Lambda_H$ is a depolarizing channel with strength 0.5%. Then, simulating F(θ) for this case shows that F is Lipschitz continuous with a constant of approximately 1.48, as illustrated in FIG. 7.

An important implication of the Lipschitz Continuity Theorem is that the uncertainty quantified by the variance of the posterior distribution yielded by Bayesian inference grows by at most a constant factor. However, while the theorem specify how the variance should grow in the worst case scenario it does not offer an understanding of what form the posterior distribution should take. Provided hereinafter is an operationally useful way to estimate how the posterior distribution evaluated at θ may change as the control parameters transition to θ'.

Let the posterior probability distribution for the objective function F evaluated at parameters θ be Pr (F(θ)). In practice, the objective function F is not estimated directly, in general. Rather, F may be estimated based on a latent variable y, such as the RB parameters (23). Marginalizing over this latent variable, the Bayesian mean estimator for F is obtained, $$\hat{F} = \int F Pr(F|\theta) dF = \int F Pr(F|\theta,y) Pr(y) dy. \quad (41)$$

For the RB case in particular, the objective function F does not depend on the control parameters θ provided that the RB parameters y are known exactly. That is, F ⊥ θ|y for the RB case, such that Pr(F|θ, y)=Pr(F|y). Moreover, Pr(F|y) is a δ-distribution supported only at F=(dp+1)/(d+1) where y=(p, A, B). The standard notation may be abused slightly, in recognizing that F=F(y) is a deterministic function. Doing so, the estimator simplifies considerably, such that $$\hat{F} = \int F Pr(F|\theta,y) Pr(y) dy = \int F(y) Pr(y) dy. \quad (42)$$

In exact Bayesian inference, the probability density Pr(y) is an arbitrary distribution, but computation of the estimator (42) is in general intractable. Perhaps the most easily generalizable distribution is the sequential Monte Carlo (SMC) approximation, also known as a particle filter, which attempts to approximate the probability density as $$Pr(F|\theta,y)Pr(y|\theta) = Pr(F,y|\theta) \approx \sum_{j=1}^{N_p} w_j \delta(y - y_j)\delta(F_i - F), \quad (43)$$

where δ is the Dirac-delta distribution and $\Sigma_j w_j = 1$. This representation is convenient for recording on a computer, observing that $(w_i, y_i, F_i)$ for each particle. In the case that F=F(y) can be treated as a deterministic function of the RB parameters, the task of recording F with each particle may be omitted, such that $$Pr(F|\theta,y)Pr(y|\theta) \approx \sum_{j=1}^{N_p} w_j \delta(y - y_j)\delta(F(y) - F). \quad (44)$$

More generally, the SMC approximation allows approximate expectation values to be estimated over the probability distribution using a finite number of points, or particles, such that the expectation value of any continuous function can be approximated with arbitrary accuracy as $N_p \to \infty$. In particular, the estimator $\hat{F}$ may be approximated within arbitrary accuracy.

The uncertainty (mean squared error) of this estimator is given by the posterior variance, $$\mathbb{V}(F) = \int F^2 Pr(F|\theta,y) Pr(y) dy - \hat{F}^2. \quad (45)$$

The posterior variance can be computed as the variance over the variable y induced from the sequential Monte Carlo approximation to the probability distribution, $$\mathbb{V}(F) \approx \sum_i w_i F(y_i)^2 - \left(\sum_i w_i F(y_i)\right)^2, \quad (46)$$

where it is assumed that F ⊥ θ|y and that Pr(F|θ) is a δ-distribution, as in the RB case. This observation is key to the present Implementation of Bayesian ACRONYM tuning.

A final note regarding approximate Bayesian inference is that the learning process can be easily implemented. From the Bayes equation, if $$Pr(F|\theta,y)Pr(y) = \sum_{j=1}^{N_p} w_j \delta(y - y_j)$$

and if evidence E is obtained in an experiment, then Bayes' theorem when applied to the weights $w_j$ yields $$w_j \leftarrow \frac{Pr(E|y_j)w_j}{\sum_j Pr(E|y_j)w_j}. \qquad (47)$$

This update procedure is repeated iteratively over all data that is collected from a set of experiments. In practice, if an accurate estimate is needed then an enormous number of particles may be needed because the weights shrink exponentially with the number of updates. This causes the effective number of particles in the approximation to shrink exponentially and with it the accuracy of the approximation to the posterior. This effect can be addressed by moving the particles to regions of high probability density. In practice, any suitable method to move the particles may be employed. Here, the implementation of particle filtering and Liu-West resampling, as provided by the QInfer package, may be used.

It is argued above that the posterior variance of the probability distribution is Lipshitz continuous, from which it follows that the variance of the probability distribution at most expands by a fixed multiplicative constant when transitioning information between different points. Operationally though, it is less clear how to choose the posterior distribution over the average gate fidelity in Bayesian ACRONYM training given prior information at a single point.

The PAB continuity theorem provides an intuition that can be used for this: each element in the support of the probability distribution is shifted by at most a fixed amount that is dictated by the Lipshitz constants for the channels. Such intuition is now expanded by showing that the prior at each step in a Bayesian ACRONYM tuning protocol can be related to the previous step in terms of the Minkowski sum and convex hull.

Definition—Convex hull. Let A be a set of vectors. Then the convex hull of A, written Conv(A) is the smallest convex set containing A, $$Conv(A) := \{\lambda a + (1-\lambda)b : a, b \in A, 0 \le \lambda \le 1\}. \qquad (48)$$

Definition—Minkowski sum. Let A and B be sets of vectors. Then the Minkowski sum A +B is defined as the convolution of A with B, $$A + B := \{a + b : a \in A, b \in B\}. \qquad (49)$$

With these concepts in place the following Corollary is now stated, which can be used to define a sensible prior distribution for $y(\theta+\delta\theta)$ given a posterior distribution for $y(\theta)$.

Corollary. Let $\Lambda_T(\theta)$ be Lipshitz continuous in the trace distance with constant $\mathcal{L}$, and let $Pr(y|\theta)$ be a probability distribution over the RB parameters $y=(p, A, B)$ for $\Lambda_T$ evaluated at some particular $\theta$. Then, for any $\delta\theta \in \mathbb{R}^n$, let $$\Delta := \|\delta\theta\|, \qquad (50)$$

$$D := \left\{\pm\Delta\frac{d\mathcal{L}(1+\bar{n})}{d-1}\right\} \times \{\pm\Delta(1+\bar{n})\mathcal{L}\} \times \{\pm\Delta(1+\bar{n})\mathcal{L}\}, \text{ and} \qquad (51)$$

$$Pr(y|\theta+\delta\theta) := \frac{1}{8}\sum_{s \in S} Pr(y-s|\theta). \qquad (52)$$

The following statements then hold:
1. $Pr(y|\theta+\delta\theta)$ is a valid prior probability distribution for $y(\theta+\delta\theta)$.
2. $\hat{y}=\int y\, Pr(y|\theta)dy=\int y\, Pr(y|\theta+\delta\theta)dy$.
3. If $Pr(y|\theta)$ has support only on $A \subset \mathbb{R}^3$, then $Pr(y|\theta+\delta\theta)$ has support only on Conv(A+D).
4. If $y_{true}(\theta) \in A$ then $y_{true}(\theta+\delta\theta) \in Conv(A+D)$.

Proof. The proof of the first claim is trivial and follows immediately from the fact that $Pr(y|\theta)$ is a probability distribution. The proof of the second claim is also straightforward. Note that $$\hat{y} := \int y\, Pr(y|\theta+\delta\theta)dy = \frac{1}{8}\int \sum_{s \in \{y\}+D} y\, Pr(y-s|\theta)dy \qquad (53)$$

$$= \frac{1}{8}\int \sum_{s \in \{y\}+D} (y+s)Pr(y|\theta)dy$$

$$= \int y\, Pr(y|\theta)dy.$$

To consider the third claim, let $c=(c_P, c_A, c_B)$ be a vector such that $|c_P| \le d\mathcal{L}(1+\bar{n})/(d-1)$ and $\max\{|c_A|, |c_B|\} \le \mathcal{L}(1+\bar{n})$. The convex hull Conv(D) consists of a convex region of identical dimensions. Since the set is convex it then follows that $c \in Conv(D)$. Put differently, the definitions of the Lipschitz functions and channels in terms of the Minkowski sum may now be expressed, such that $$y(\Lambda_T(\theta+\delta\theta)) \in Conv(\{y(\Lambda_T(\theta))\}+D). \qquad (54)$$

Taking the union over all vectors a in the support of $Pr(y|\theta)$, $$supp(y|\theta+\delta\theta) \subseteq Conv(supp(y|\theta)+D). \qquad (55)$$

From the linearity of convex hulls under Minkowski summation, $$Conv(supp(y|\theta)+D) = Conv(supp(y|\theta))+Conv(D). \qquad (56)$$

This shows that if the rules above are adhered to in generating a prior distribution for the RB parameters at $\theta+\delta\theta$, then the resultant distribution does not introduce any bias into the current estimate of the parameters, which is codified by the mean of the posterior distribution. Also, if the true model is within the support of the prior distribution at $\theta$ then it also will be at $\theta+\delta\theta$. This is important because it states that the resulting distribution may be used to give a credible region for the RB parameters. Thus this choice of prior is well justified, and furthermore, if the measurement process reduces the posterior variance faster than it expands when $\theta$ is updated, it will allow very accurate estimates of the true RB parameters without any need to extract redundant information.

The above analysis shows that, under assumptions of Lipshitz continuity of the likelihood function, the posterior distribution found at a given step of the algorithm can be used to provide a prior for the next step. This holds provided that a new prior is formed that expands the variance of posterior distribution, by forming a posterior distribution that is the Minkowski sum of the original posterior distribution and the region S, the convex hull of which is guaranteed to contain the true hypothesis, given that it was contained in the convex hull of the support of the prior.

While this shows in theory, it will now be shown in practice that the ability to re-use prior information can reduce the information needed to calibrate a simulated quantum device. The Clifford gates in the device, which are taken to be the generators of the single-qubit Clifford group, are H and S. It will be assumed that H can be implemented exactly, but that S has an overrotation error such that $$S(\theta)=e^{-i\theta Z}S, \qquad (57)$$

for some value of θ. While this is called an "overrotation" no assumption is made that θ>0. Further, a depolarizing noise will be applied at a per-gate level to the system with strength 0.005. Accordingly, the channels applied are $$\Lambda_H: \rho \mapsto 0.995 H\rho H + 0.005(\mathbb{1}/2),$$

$$\Lambda_{S(\theta)}: \rho \mapsto 0.995 e^{-i\theta Z} S\rho S^\dagger e^{i\theta Z} + 0.005(\mathbb{1}/2). \quad (58)$$

It is further assumed that the user has control over the parameter θ, but not that the user knows the functional form, or that setting θ=0 which will yield optimal performance. The goal of then Bayesian ACRONYM algorithm is then to allow the method to discover that θ=0 yields the optimal performance via local search.

Figure 8:
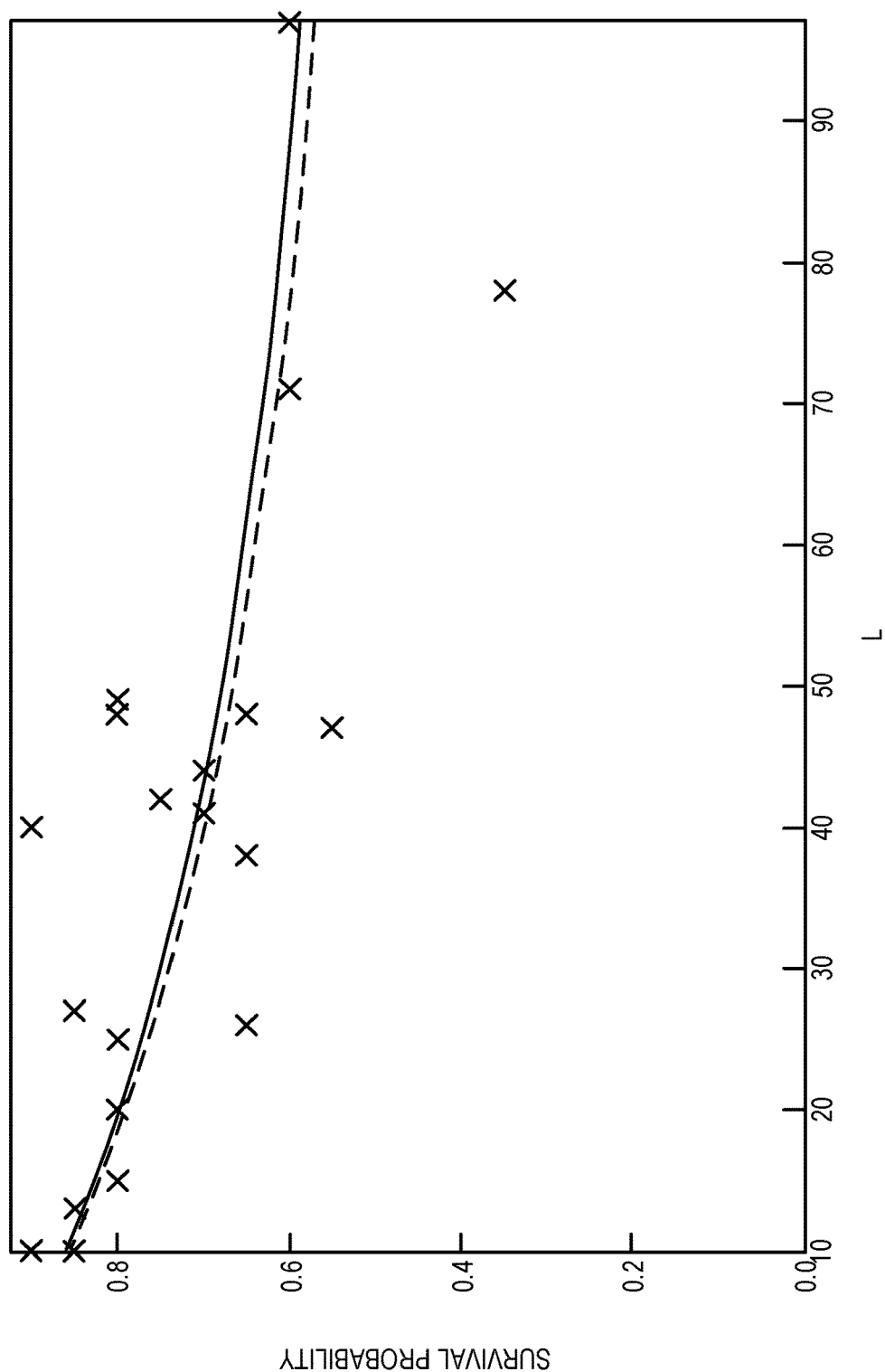
FIG. 8 is an example plot of an observed survival probability as a function of sequence length using twenty measurements per length, for an overrotation model.

FIG. 8 shows observed survival probabilities as a function of sequence lengths using 20 measurements (shots) per length for an overrotation model with θ=0.04. Here, the solid line represents the true value for the survival probability, $(A-B)p^{\mathcal{L}} +B$, as a function of the sequence length $\mathcal{L}$, and the dashed line represents the estimate of the survival probability. The prior was set to be uniform for p and A on [0, 1] and the prior B was set to be the normal distribution $\mathcal{N}(0.5, 0.05^2)$.

Figure 9:
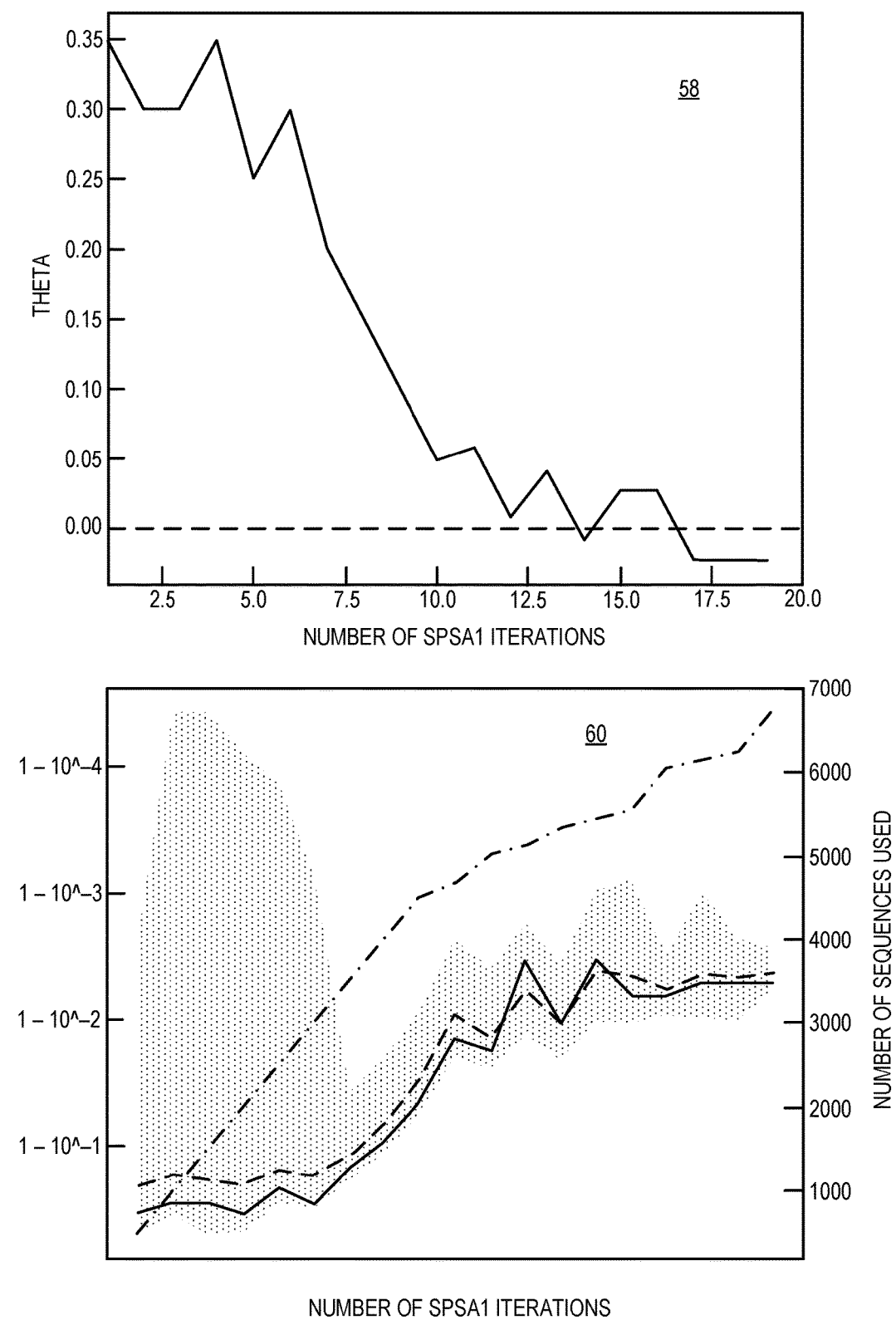
FIG. 9 shows example plots of overrotation angle and objective-function value (average gate fidelity) versus number of SPSA iterations for an overrotation model.

FIG. 9 illustrates overrotation angle and objective function values for an overrotation model with a 0.35 radian overrotation initially with a target error of 0.005 in F as measured by the posterior standard-deviation. Left plot 58 shows, as the solid line, the overrotation angle as a function of number of iterations of SPSA taken, while the broken line shows the goal. Right plot 60 shows the estimated average gate infidelity as a function of the number of SPSA iterations and the total number of sequences used to achieve that level of infidelity. In particular, the dashed line shows the estimated F, the solid line shows the true F, and the dot-dashed line gives the number of applied sequences. The shaded region represents a 70% credible region for the infidelity. In effect, these plots show the impact that using Bayesian inference to estimate RB parameters can have in data limited cases of the overrotation problem. Specifically, Bayesian ACRONYM training is applied to calibrate the overrotation to within an error of 0.005, which is equal to the dephasing error included in the channels in the example hereinabove.

A broad prior was taken, and despite the challenges of learning a good model from least-squares fitting, the survival probability is learned accurately. Learned also are the parameters A, B and p, the latter of which gives us the average gate fidelity needed for ACRONYM training via (23a). As the required accuracy for the estimate of p increases, the advantages gleaned from using Bayesian methods relative to fitting disappear. However, in the present context this observation is significant, because the objective is to tune the performance of quantum devices in the small-data limit rather than the large-data limit, and use prior information from previous experiments to compensate.

Local search is implemented using SPSA with learning rate 0.05, a step of 0.05 used to compute approximate gradients and a maximum step size of 0.1. The method is repeated until the posterior variance in the average gate fidelity is less than $0.005^2$. In this example, a Lipshitz constant of 1.48 is used, which was numerically computed as a bound to give an appropriate amount of diffusion for the posterior distribution during an update. Bayesian inference is approximated using a particle filter with 256 000 particles and Liu-West resampling with a resample threshold of 1/256 as implemented by QInfer. Single shot experiments are used with a maximum number of sequences of 500 per set of parameters.

Perhaps the key observation is that throughout the tuning process the true parameters for the overrotation error remain within the 70% credible region reported by QInfer, which suggests if anything that the credible region is pessimistic. The estimate of F also closely tracks the true throughout the learning process and also the amount of data required for the tuning process is minimal, less than 1 kB.

Figure 10:
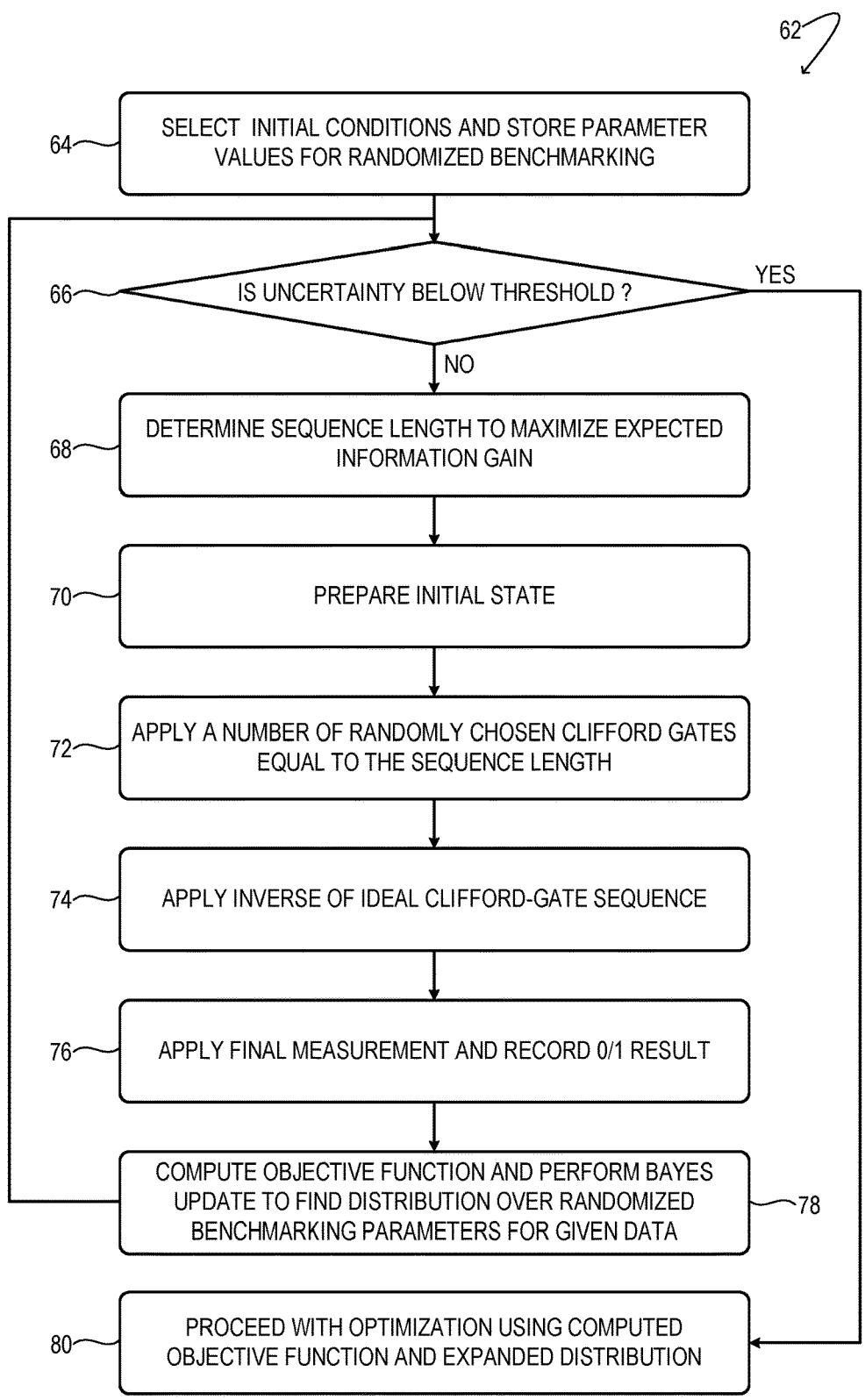
FIG. 10 illustrates an example method of Bayesian randomized benchmarking for estimating the average gate fidelity of Clifford gates in a quantum computer.

FIG. 10 illustrates an example method 62 of applying a Bayesian-informed variant of randomized benchmarking (RB) to the problem of estimating the average gate fidelity of Clifford gates in a quantum computer. Method 62 is a more specific implementation of steps 42 and 44 of Bayesian tuning method 38 as illustrated in FIG. 5.

At 64 of method 62, initial conditions and processing parameters are selected for RB and stored in computer memory 22. The initial conditions may include: initial control parameter values $\theta_0$; the number of measurements per sequence length $n_{shots}$; the required accuracy for F, defined as $\sigma_{req}$; the SPSA1 parameter values (a, b, s, t); the largest allowed step in θ; the target objective function value, $F_{target}$; the initial prior $\pi_0$; and the value L of the Lipschitz continuity assumed for F. In some examples, the act of setting the initial conditions may include initially synthesizing the prior distribution as appropriate for the selected RB parameters.

At 66, it is determined whether the quantum-gate uncertainty as quantified by the objective function is above a predetermined threshold. In this context, the AGF is a natural choice for the objective function. In other examples, alternative objective functions—e.g., a diamond distance to an ideal channel—may be defined, evaluated, and used for the determination at 66. If the uncertainty is above the threshold, then at 68 an appropriate length of a sequence of Clifford gates usable for RB is determined. The length may be selected so as to maximize the information available from RB. For instance, the selected length may be one that increases a sensitivity on any new data of the fidelity as quantified by an appropriate objective function (e.g., the average gate fidelity).

At 70 an initial state is prepared, where $\pi \leftarrow \pi_0$ and $\theta \leftarrow \theta_0$. More specifically, one or more qubits of a register in the quantum computer may be manipulated in order to set the one or more qubits to an initial superposition of quantum states desirable for subsequent manipulations.

At 72 the one or more qubits are now manipulated to effect on the one or more qubits a Clifford-gate sequence of the determined length, using stored control-parameter values. In some examples, the Clifford gates in the sequence may be randomly chosen, whereas the length of the sequence is the length determined at 68. In some examples, the sequence of Clifford gates applied at this stage may be interleaved with at least one non-Clifford gate.

At 74 the one or more qubits are again manipulated using the stored control-parameter values, this time to reverse the Clifford-gate sequence applied at 72 on the same one or more qubits. At 76 the one or more qubits are interrogated in order to measure the quantum state therein, yielding new data that provides an estimate of performance metrics of the quantum device. In other words, a final measurement is applied, and a result of 0 or 1 is recorded. In particular, data is collected at θ until $\text{Var}[F] \leq \sigma_{req}^2$, and $\hat{F} \leftarrow \mathbb{E}[F(\theta)|\text{data}]$, and $i_{iter} \leftarrow 0$. The main loop of method 62 may be expressible according to the following algorithm:

while $\hat{F} \leq F_{target}$ do
$i^{iter}$++
$\Delta \leftarrow$ a random ±1 vector the same length as θ
step $\leftarrow a/(1+i_{iter}^s)$ gain←b/(1+$i_{iter}^r$)
δθ←step·Δ
estimate $\hat{F}(\theta+\delta\theta)$ using Bayesian randomized benchmarking
u←gain·Δ($\hat{F}(\theta+\delta\theta)-\hat{F}(\theta)$)
if any component of u larger than max update then
    u←u/$\max_{u \in u}$|u|
if |$\hat{F}(\theta+\delta\theta)-\hat{F}(\theta)$|≥√Var[F(θ+δθ)] then
    θ+=u
else if $\hat{F}(\theta+\delta\theta)<\hat{F}(\theta)$ then
    θ-=step·Δ
else
    θ+=step·Δ

At 78 of method 62, the objective function is computed, which quantifies the fidelity (and conversely the uncertainty) of the reversed Clifford-gate sequence at the stored control-parameter values. This computation employs the new data in addition to the prior distribution obtained by prior interrogation of the one or more qubits using prior control-parameter values. Here, a Bayesian update is performed in order to find the distribution over the randomized benchmarking parameters in view of the new data. More specifically, the prior distribution is expanded to incorporate uncertainty in the objective function at the stored control-parameter values. Execution of the method then returns to 66, where the manipulating, interrogating, and computing steps are repeated, this time employing the expanded prior distribution. If the uncertainty quantified by the objective function is now below the threshold uncertainty, then the computed objective function and expanded distribution, at 80, are accepted and used for continued optimization of the control-parameter values.

This disclosure demonstrates the efficient reuse of information gathered from tuning quantum gates in experiments that use nearby vectors of parameters. The method thereby reduces the amount of data needed to find the objective function, as well as to evaluate the gradients, relative to the approach in which the objective function is evaluated afresh at every iteration. This strategy is here applied to ACRONYM tuning, which uses the average gate fidelity reported by randomized benchmarking as a figure of merit for optimization. The disclosed method is verified numerically, by showing that a model of a noisy qubit with a systematic overrotation error can be corrected to within an error of at most 0.05 percent using less than 1 kB of data.

Looking forward, this work suggests that Bayesian methods can be used broadly to tune quantum devices. While the initial focus is on randomized benchmarking as a method to yield the objective function used for tuning, the present overall strategy is by no means limited to that implementation. Other figures of merit can also be estimated similarly. For example, an estimates returned by protocols such as gateset tomography or Hamiltonian learning may be used to provide the objective. Such extensions may be useful in order to optimize not only device performance but also to gain an understanding of why a device is performing poorly. Such an approaches could prove invaluable for calibrating near-term quantum devices that aim to demonstrate quantum advantage or error correction, which have rich control landscapes that may resist human intuition. By optimally using prior information between tuning steps, and potentially between devices, it may be possible to overcome these daunting control objectives, while also reducing the amount of data required to do so.

Returning now to FIG. 1, this drawing schematically shows a non-limiting embodiment of a computer system in the form of quantum computer 10, that can enact one or more of the methods and processes described above. The computer system is shown in simplified form. As noted hereinabove, the computer system includes a processor 20 and associated computer memory 22. The computer system may optionally include a display device, input device, network device, and/or other components not shown in the drawings.

Processor 20 includes one or more physical devices configured to execute instructions. For example, the processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result. Processor 20 may include one or more individual processors configured to execute software instructions. Additionally or alternatively, the processor may include one or more hardware or firmware processors configured to execute hardware or firmware instructions. Processors may be single-core or multi-core, and the instructions executed thereon may be configured for sequential, parallel, and/or distributed processing. Individual components of the processor optionally may be distributed among two or more separate devices, which may be remotely located and/or configured for coordinated processing. Aspects of the processor may be virtualized and executed by remotely accessible, networked computing devices configured in a cloud-computing configuration.

Computer memory 22 includes one or more physical devices configured to hold instructions executable by the processor to implement the methods and processes described herein. When such methods and processes are implemented, the state of computer memory 22 may be transformed—e.g., to hold different data. Computer memory 22 may include removable and/or built-in devices. Computer memory 22 may include optical memory (e.g., CD, DVD, HD-DVD, Blu-Ray Disc, etc.), semiconductor memory (e.g., RAM, ROM, EPROM, EEPROM, etc.), and/or magnetic memory (e.g., hard-disk drive, tape drive, MRAM, etc.), among others. Computer memory 22 may include volatile, nonvolatile, dynamic, static, read/write, read-only, random-access, sequential-access, location-addressable, file-addressable, and/or content-addressable devices. It will be appreciated that computer memory 22 includes one or more physical devices. However, aspects of the instructions described herein alternatively may be propagated by a communication medium (e.g., an electromagnetic signal, an optical signal, etc.) that is not held by a physical device for a finite duration.

Aspects of processor 20 and computer memory 22 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms 'module,' 'program,' and 'engine' may be used to describe an aspect of a computer system implemented to perform a particular function. In some cases, a module, program, or engine may be instantiated via processor 20 executing instructions held by computer memory 22. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms 'module,' 'program,' and 'engine' may encompass individual or groups of executable files, data files, libraries, drivers, scripts, database records, etc. It will be appreciated that a 'service', as used herein, is an application program executable across multiple user sessions. A service may be available to one or more system components, programs, and/or other services. In some implementations, a service may run on one or more server-computing devices.

When included, a display device 82 may be used to present a visual representation of data held by computer memory 22. This visual representation may take the form of a graphical user interface (GUI). As the herein described methods and processes change the data held by the computer memory, and thus transform the state of the computer memory, the state of the display device may likewise be transformed to visually represent changes in the underlying data. When included, an input device 84 may comprise or interface with one or more user-input components such as a keyboard, mouse, or touch screen. When included, network device 86 may be configured to communicatively the couple computer system with one or more other computing devices. A network device may include wired and/or wireless communication components compatible with one or more different communication protocols. As non-limiting examples, the network device may be configured for communication via a wireless telephone network, or a wired or wireless local- or wide-area network. In some embodiments, the network device may allow computer system 10 to send and/or receive messages to and/or from other devices via a network such as the Internet.

One aspect of this disclosure is directed to a method for tuning a quantum gate of a quantum computer. The method comprises: interrogating one or more qubits of the quantum computer using stored control-parameter values and yielding new data; computing an objective function quantifying operational quality of the quantum gate at the stored control-parameter values, such computing employing the new data in addition to a prior distribution over features used to compute the objective function, wherein the prior distribution is obtained by previous adaptive or non-adaptive interrogation of the one or more qubits; updating the stored control-parameter values; expanding the prior distribution to incorporate uncertainty in the objective function at the updated control-parameter values; re-interrogating the one or more qubits using the updated control-parameter values; and re-computing the objective function using the expanded prior distribution.

In some implementations, the method further comprises accepting and subsequently using the stored control-parameter values for the quantum gate if the operational quality quantified by the objective function exceeds a threshold operational quality. In some implementations, the operational quality comprises a quantum-gate fidelity, the threshold operational quality comprises a threshold quantum-gate fidelity, and the threshold quantum-gate fidelity is determined based on an estimate of a posterior uncertainty in the quantum-gate fidelity as quantified by the objective function. In some implementations, computing the objective function includes estimating an average gate fidelity over an ensemble of randomly selected quantum gates. In some implementations, interrogating the one or more qubits includes a randomized benchmarking protocol including subjecting the one or more qubits to a sequence of quantum gates and to an inverse of the sequence of quantum gates. In some implementations, updating the stored control-parameter values includes updating according to a multivariable parameter-optimization algorithm. In some implementations, the quantum gate is one of a plurality of different quantum gates represented in the objective function, and each of the plurality of different quantum gates is tuned via the method. In some implementations, the objective function varies in relation to at least one overrotation of the quantum state of the one or more qubits.

Another aspect of this disclosure is directed to a method for tuning one or more quantum gates of a quantum computer. This method comprises: manipulating one or more qubits of the quantum computer to effect a Clifford-gate sequence on the one or more qubits using stored control-parameter values; manipulating the one or more qubits to reverse the Clifford-gate sequence on the one or more qubits using the stored control-parameter values; interrogating the one or more qubits to measure a quantum-state of the one or more qubits, yielding new data; computing an objective function quantifying fidelity of the reversed Clifford-gate sequence at the stored control-parameter values, such computing employing the new data in addition to a prior distribution obtained by prior interrogation of the one or more qubits using prior control-parameter values; updating the stored control-parameter values; expanding the prior distribution to incorporate uncertainty in the objective function at the updated control-parameter values; and repeating said manipulating, interrogating, and computing the objective function employing the expanded prior distribution and the updated control-parameter values.

In some implementations, the method further comprises initially selecting the prior distribution for randomized benchmarking parameters. In some implementations, the method further comprises determining a length of the Clifford-gate sequence. In some implementations, the length of the Clifford-gate sequence is determined so as to increase sensitivity on the new data of the fidelity as quantified by the objective function. In some implementations, the method further comprises interleaving the Clifford-gate sequence with at least one non-Clifford gate. In some implementations, the method further comprises accepting and subsequently using the stored control-parameter values for the quantum gate if the fidelity quantified by the objective function exceeds a threshold fidelity. In some implementations, updating the stored control-parameter values includes updating according to a multivariable parameter-optimization algorithm. In some implementations, the objective function comprises an average gate fidelity or a diamond distance to an ideal channel.

Another aspect of this disclosure is directed to a quantum computer comprising: a register including a plurality of qubits; a modulator configured to implement a quantum-logic operation on the plurality of qubits according to stored control-parameter values; a demodulator configured to reveal data reflecting a quantum state of the plurality of qubits; a controller operatively coupled to the modulator and to the demodulator; and associated with the controller, computer memory holding the stored control-parameter values and holding instructions that cause the controller to: interrogate the plurality of qubits using stored control-parameter values and yielding new data, compute an objective function quantifying fidelity of the quantum-logic operation at the stored control-parameter values, such computing employing the new data in addition to a prior distribution over features used to compute the objective function, update the stored control-parameter values, expand the prior distribution to incorporate uncertainty in the objective function at the updated control-parameter values, re-interrogate the plurality of qubits using the updated control-parameter values, and re-compute the objective function using the expanded prior distribution.

In some implementations, the modulator is configured to transmit a signal to the plurality of qubits based on modulation data from the controller. In some implementations, the signal is one or more of electrical, optical, and magnetic. In some implementations, the demodulator is configured to receive a signal from the plurality of qubits and furnish the new data to the controller based on the signal.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for tuning a quantum gate of a quantum computer, the method comprising:
   interrogating one or more qubits of the quantum computer using stored control-parameter values and yielding new data;
   computing an objective function quantifying fidelity of the quantum gate at the stored control-parameter values, such computing employing the new data in addition to a prior distribution over features used to compute the objective function, wherein the prior distribution is obtained by previous adaptive or non-adaptive interrogation of the one or more qubits;
   updating the stored control-parameter values;
   expanding the prior distribution to incorporate uncertainty in the objective function at the updated control-parameter values;
   re-interrogating the one or more qubits using the updated control-parameter values;
   re-computing the objective function using the expanded prior distribution; and
   accepting and subsequently using the stored control-parameter values for the quantum gate if the fidelity quantified by the objective function exceeds a threshold fidelity, wherein the threshold fidelity is determined based on an estimate of a posterior uncertainty in the fidelity as quantified by the objective function.

2. The method of claim 1 wherein computing the objective function includes estimating an average gate fidelity over an ensemble of randomly selected quantum gates.

3. The method of claim 1 wherein interrogating the one or more qubits includes a randomized benchmarking protocol including subjecting the one or more qubits to a sequence of quantum gates and to an inverse of the sequence of quantum gates.

4. The method of claim 1 wherein updating the stored control-parameter values includes updating according to a multivariable parameter-optimization algorithm.

5. The method of claim 1 wherein the quantum gate is one of a plurality of different quantum gates represented in the objective function, and wherein each of the plurality of different quantum gates is tuned.

6. The method of claim 1 wherein the objective function varies in relation to at least one overrotation of the quantum state of the one or more qubits.

7. The method of claim 1 further comprising initially selecting the prior distribution for randomized benchmarking parameters.

8. A method for tuning one or more quantum gates of a quantum computer, the method comprising:
   manipulating one or more qubits of the quantum computer to effect a Clifford-gate sequence on the one or more qubits using stored control-parameter values;
   manipulating the one or more qubits to reverse the Clifford-gate sequence on the one or more qubits using the stored control-parameter values;
   interrogating the one or more qubits to measure a quantum state of the one or more qubits, yielding new data;
   computing an objective function quantifying fidelity of the reversed Clifford-gate sequence at the stored control-parameter values, such computing employing the new data in addition to a prior distribution obtained by prior interrogation of the one or more qubits using prior control-parameter values;
   updating the stored control-parameter values;
   expanding the prior distribution to incorporate uncertainty in the objective function at the updated control-parameter values;
   repeating said manipulating, interrogating, and computing the objective function employing the expanded prior distribution and the updated control-parameter values; and
   accepting and subsequently using the stored control-parameter values for the Clifford-gate sequence if the fidelity quantified by the objective function exceeds a threshold fidelity, wherein the threshold fidelity is determined based on an estimate of a posterior uncertainty in the fidelity as quantified by the objective function.

9. The method of claim 8 further comprising initially selecting the prior distribution for randomized benchmarking parameters.

10. The method of claim 8 further comprising determining a length of the Clifford-gate sequence.

11. The method of claim 10 wherein the length of the Clifford-gate sequence is determined so as to increase sensitivity on the new data of the fidelity as quantified by the objective function.

12. The method of claim 8 further comprising interleaving the Clifford-gate sequence with at least one non-Clifford gate.

13. The method of claim 8 wherein updating the stored control-parameter values includes updating according to a multivariable parameter-optimization algorithm.

14. The method of claim 8 wherein the objective function comprises an average gate fidelity or a diamond distance to an ideal channel.

15. The method of claim 8 wherein the objective function varies in relation to at least one overrotation of the quantum state of the one or more qubits.

16. A quantum computer comprising:
   a register including a plurality of qubits;
   a modulator configured to implement a quantum-logic operation on the plurality of qubits according to stored control-parameter values;
   a demodulator configured to reveal data reflecting a quantum state of the plurality of qubits;

a controller operatively coupled to the modulator and to the demodulator; and associated with the controller, computer memory holding the stored control-parameter values and holding instructions that cause the controller to:
  interrogate the plurality of qubits using stored control-parameter values and yielding new data,
  compute an objective function quantifying fidelity of the quantum-logic operation at the stored control-parameter values, such computing employing the new data in addition to a prior distribution over features used to compute the objective function,
  update the stored control-parameter values,
  expand the prior distribution to incorporate uncertainty in the objective function at the updated control-parameter values,
  re-interrogate the plurality of qubits using the updated control-parameter values,
  re-compute the objective function using the expanded prior distribution; and
  accent and subsequently use the stored control-parameter values for the quantum-logic operation if the fidelity quantified by the objective function exceeds a threshold fidelity, wherein the threshold fidelity is determined based on an estimate of a posterior uncertainty in the fidelity as quantified by the objective function.

17. The quantum computer of claim 16 wherein the modulator is configured to transmit a signal to the plurality of qubits based on modulation data from the controller.

18. The quantum computer of claim 17 wherein the signal is one or more of electrical, optical, and magnetic.

19. The quantum computer of claim 16 wherein the demodulator is configured to receive a signal from the plurality of qubits and furnish the new data to the controller based on the signal.

20. The quantum computer of claim 16 wherein the objective function varies in relation to at least one overrotation of the quantum state of the plurality of qubits.

* * * * *